(12) United States Patent
Motz et al.

(10) Patent No.: US 11,728,823 B2
(45) Date of Patent: Aug. 15, 2023

(54) ANALOG-DIGITAL CONVERTER APPARATUS, SENSOR SYSTEM AND METHOD FOR ANALOG-DIGITAL CONVERSION

(71) Applicant: Infineon Technologies AG, Neubiberg (DE)

(72) Inventors: Mario Motz, Wernberg (AT); Florian Brugger, Villach (AT); Carlos Humberto Garcia Rojas, Villach (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 34 days.

(21) Appl. No.: 17/534,635

(22) Filed: Nov. 24, 2021

(65) Prior Publication Data

US 2022/0173750 A1 Jun. 2, 2022

(30) Foreign Application Priority Data

Nov. 27, 2020 (DE) .......................... 102020131464.7
Oct. 29, 2021 (DE) .......................... 102021128262.4

(51) Int. Cl.
*H03M 3/00* (2006.01)
*H03M 1/06* (2006.01)

(52) U.S. Cl.
CPC ........... *H03M 3/34* (2013.01); *H03M 1/0626* (2013.01); *H03M 3/356* (2013.01); *H03M 3/464* (2013.01)

(58) Field of Classification Search
CPC ...... H03M 3/34; H03M 1/0626; H03M 3/356; H03M 3/464; H03M 1/066; H03M 1/66; H03M 3/39; H03M 3/458; H03M 3/466; H03M 3/474; H03M 3/494; H03M 3/30
USPC ................................................ 341/143, 155
See application file for complete search history.

(56) References Cited

U.S. PATENT DOCUMENTS

| 7,362,255 B1 * | 4/2008 | Tsyrganovich | ......... H03M 3/34 341/172 |
| 7,714,757 B2 * | 5/2010 | Denison | ................. A61B 5/316 341/143 |
| 7,995,679 B2 * | 8/2011 | Ranganathan | ........... G01D 5/24 375/350 |
| 9,714,987 B2 | 7/2017 | Kashmiri et al. | |
| 2014/0077873 A1 | 3/2014 | Motz et al. | |
| 2015/0381198 A1 | 12/2015 | Lasseuguette et al. | |
| 2019/0103880 A1 | 4/2019 | Chen et al. | |
| 2019/0190535 A1 | 6/2019 | Tsinker | |

FOREIGN PATENT DOCUMENTS

JP 2017191518 A 10/2017

\* cited by examiner

*Primary Examiner* — Khai M Nguyen
(74) *Attorney, Agent, or Firm* — Harrity & Harrity, LLP

(57) ABSTRACT

Apparatuses and methods for analog-digital conversion and corresponding systems having a sensor and an apparatus of this type are provided. Demodulation is executed with no variable preamplification, followed by continuous-time analog-digital conversion, at least in time segments, which further employs chopper techniques.

28 Claims, 17 Drawing Sheets

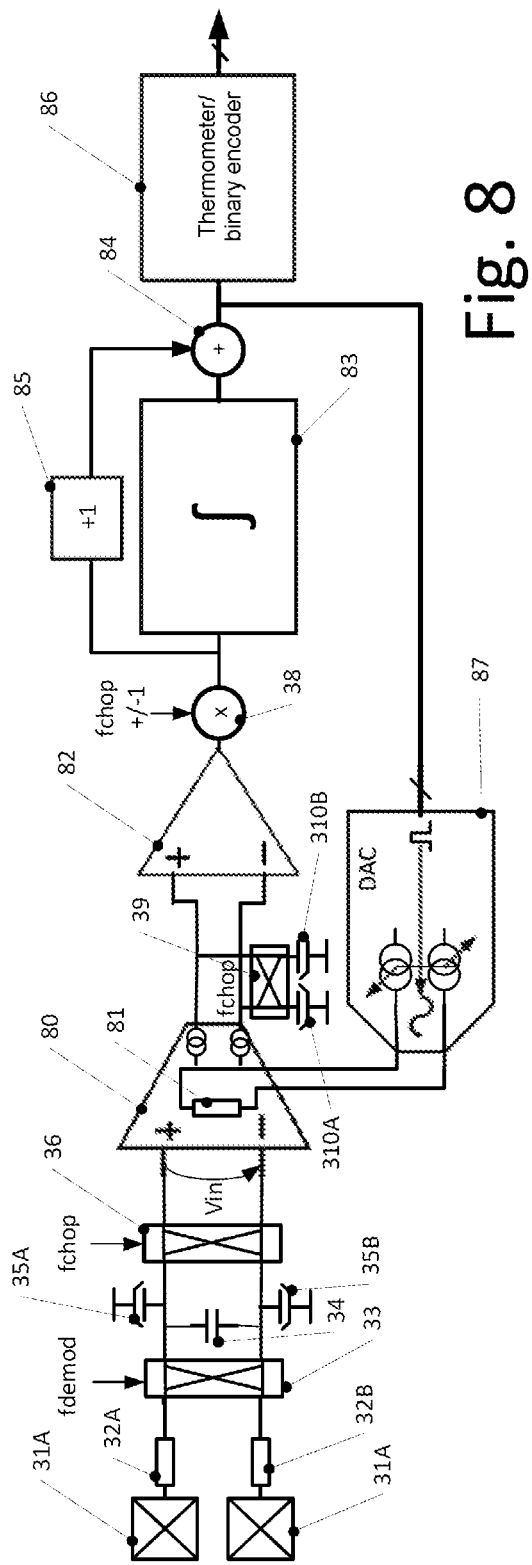
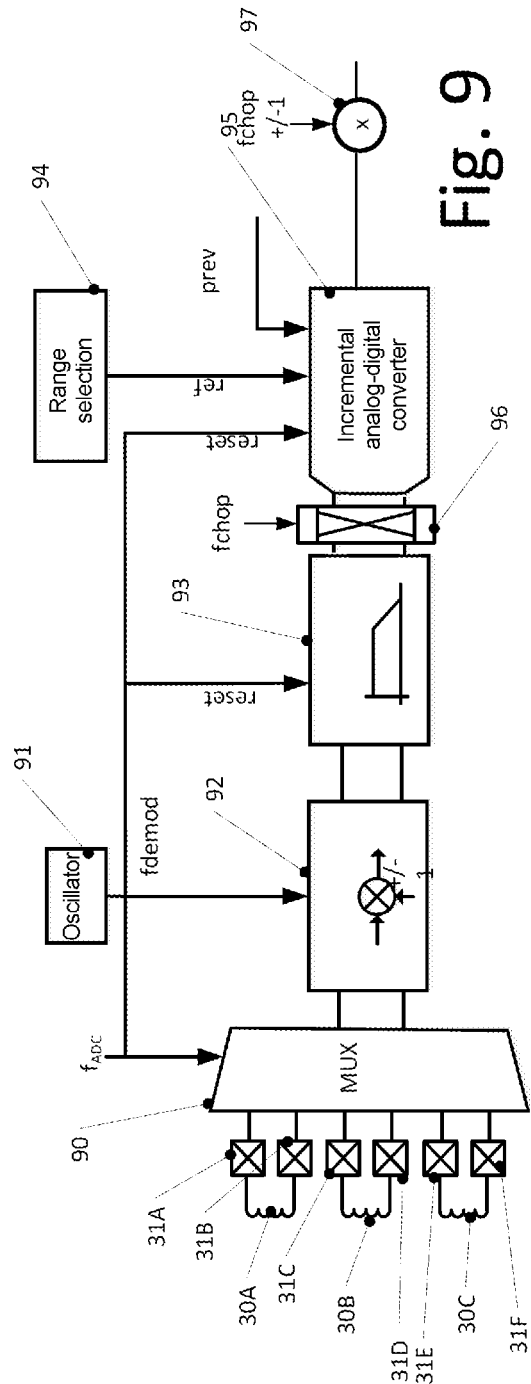
Fig. 8
Fig. 9

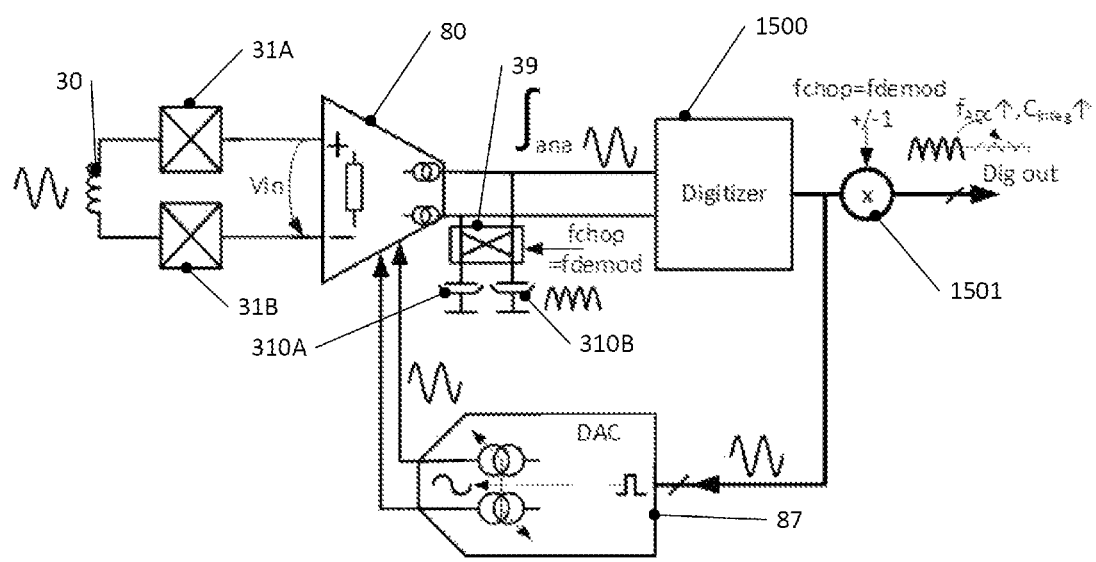
Fig. 15A
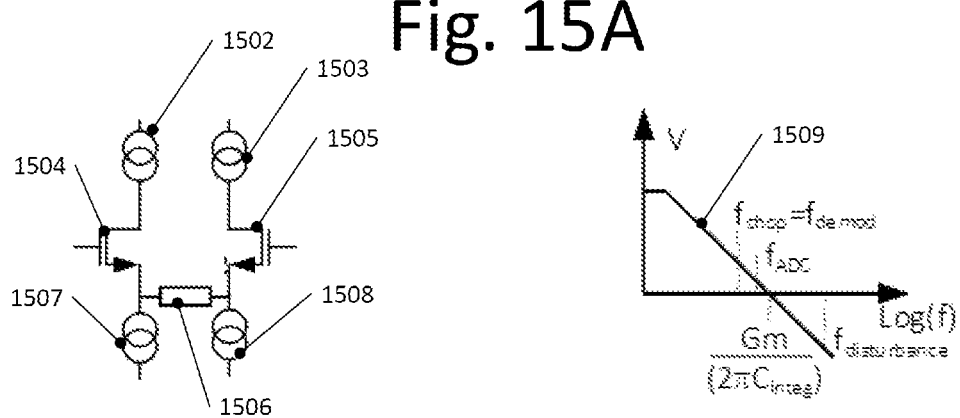
Fig. 15B
Fig. 15C

ANALOG-DIGITAL CONVERTER APPARATUS, SENSOR SYSTEM AND METHOD FOR ANALOG-DIGITAL CONVERSION

RELATED APPLICATION

This application claims priority to German Patent Application No. 102021128262.4 filed on Oct. 29, 2021 and German Patent Application No. 102020131464.7 filed on Nov. 27, 2020, which are incorporated herein by reference in their entirety.

FIELD

The present application relates to apparatuses for analog-digital conversion, to sensor systems which comprise apparatuses of this type for the conversion of an analog signal output from a sensor, and to corresponding methods.

BACKGROUND

In many applications, an analog signal is converted into a digital signal, and then undergoes further digital processing. These include, for example, sensor applications, in which a physical variable, for example speed, position and the like, is detected by means of a sensor, a corresponding analog signal is output by the sensor, and is then converted into a digital signal for the purposes of further processing.

In some cases, the analog signal to be converted can comprise a relatively high dynamic range, for example with respect to a signal voltage. One example of sensors which can comprise a high dynamic range of this type in their output signal are inductive motion sensors. In sensors of this type, by the infeed of an excitation signal to an excitation coil, a radio-frequency magnetic field is generated. The magnetic field is measured by means of a number of detection coils. The magnetic coupling between the excitation coil and the detection coils is dependent, for example, here on a position of a rotor, which has an inductance. The excitation signal can have a frequency in the region of 3.5 MHz. A voltage output by the receiver coils can lie, for example, within a range between 4 and 120 mV, which corresponds to a factor of 30 between the lowest and the highest voltage. In combination with the radio frequency (for example, 3.5 MHz), this constitutes a challenge for the subsequent demodulation (conversion of the sensor signal to a lower frequency) and analog-digital conversion.

In conventional approaches, one or more amplifiers with variable amplification (AGC, or adjustable gain control) are employed. Depending on the level of the input signal, the variable amplification is adjusted in order to thus provide a signal which is to be ultimately converted by an analog-digital converter and has a reduced dynamic range. Amplifiers of this type are frequently combined with low-pass filters, in order to suppress signal convolution effects (aliasing) and filter out unwanted radio-frequency components. Low-pass filters of this type require a corresponding chip surface. Even amplifiers with variable amplification require a corresponding space on the chip, thereby increasing the current consumption.

Other conventional approaches require channel filters, in order to filter out frequencies outside a useful frequency range (for example, the above-mentioned 3.5 MHz), and/or buffers up-circuit of an analog-digital converter circuit, which can result in offset errors and additional current consumption.

SUMMARY

An analog-digital converter apparatus according to claim 1 or 6, a system according to claim 19 and a method according to claim 23 or 28 are provided. Further embodiments are defined in the sub-claims.

According to one exemplary embodiment, an apparatus for analog-digital conversion is provided, including:

a demodulator for the demodulation of an input signal using a demodulation signal which has a demodulation frequency, with no variable preamplification, a chopper modulator arranged down-circuit of the demodulator, for chopping on the basis of a chopper signal;

an analog-digital converter arranged down-circuit of the chopper modulator and operating in continuous-time mode, at least in time segments; and a chopper demodulator for chopping on the basis of the chopper signal.

According to a further exemplary embodiment, an apparatus for analog-digital conversion is provided, including:

an analog-digital converter operating in continuous-time mode, at least in time segments, and including:

at least one integrating capacitor, which is connected to the remainder of the analog-digital converter in accordance with a chopper signal, wherein the chopper signal has a frequency which is equal to a demodulation frequency for the demodulation of an input signal of the device; and a chopper demodulator for chopping on the basis of the chopper signal.

According to a further exemplary embodiment, a system is provided, including:

a sensor; and an apparatus for analog-digital conversion, as described above, for the processing of a signal from the sensor.

According to yet another exemplary embodiment, a method for analog-digital conversion is provided, including:

direct demodulation of an input signal with no variable preamplification; and continuous-time analog-digital conversion, at least in time segments, of the demodulated input signal with chopper modulation and chopper demodulation.

According to a further exemplary embodiment, a method for analog-digital conversion is provided, including continuous-time analog-digital conversion, at least in time segments, of an input signal, wherein the continuous-time analog-digital conversion, at least in time segments, includes operation of integrated capacitors on the basis of a chopper signal, wherein the chopper signal has a chopper frequency which is equal to a demodulation frequency for the demodulation of an input signal to be converted.

The above summary constitutes only a short overview of some embodiments, and is not to be considered to be limiting. In particular, other embodiments can include features other than those specified above.

BRIEF DESCRIPTION OF THE DRAWINGS

FIG. 8 shows a circuit diagram of a system according to one exemplary embodiment.

FIG. 9 shows a circuit diagram of a system according to one exemplary embodiment.

FIG. 15A shows a circuit diagram of a system according to one exemplary embodiment.

FIG. 15B illustrates a voltage/current converter according to FIG. 15A.

FIG. 15C shows a diagram for the illustration of the system according to FIG. 15A.

DETAILED DESCRIPTION

Various exemplary embodiments are described in detail hereinafter. These exemplary embodiments are not to be considered to be limiting, but serve for illustration only. For example, some exemplary embodiments are described having a multiplicity of features (components, apparatuses, process steps, processes and the like). In other exemplary embodiments, some of these features can be omitted, or replaced by alternative features. Features of different exemplary embodiments can be combined. Accordingly, variations and modifications or specific parts of apparatuses, which are described for one exemplary embodiment, can also be applied to other exemplary embodiments and, consequently, are not repeatedly described.

Connections and couplings relate to electrical connections and couplings, unless indicated otherwise. Connections or couplings of this type can be modified, for example by the addition of components or the removal of components, provided that the basic function of the connection or coupling, for example the delivery of a voltage, the communication of an electrical signal or the communication of information, is not significantly affected.

In addition to the features which are explicitly represented, further features, for example conventional features which are employed in sensor systems and corresponding circuits, can be provided.

Figure 1:
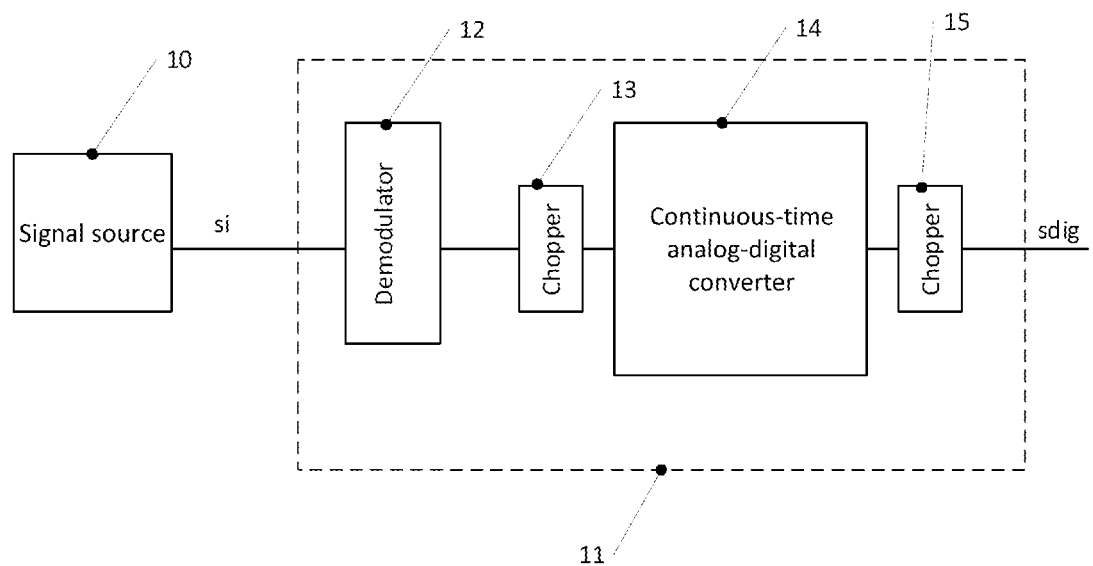
FIG. 1 shows a block diagram of a system according to one exemplary embodiment.

FIG. 1 shows a block diagram of a system, which comprises an analog-digital converter apparatus 11 according to one exemplary embodiment.

The system according to FIG. 1 comprises a signal source 10 which outputs an analog signal si. The analog signal si can have a relatively high frequency, for example, greater than 1 MHz, greater than 3 MHz or, for example, approximately 3.5 MHz, but is not restricted thereto. In some exemplary embodiments, the signal source 10 can be a sensor. In particular, the signal source 10 can be an inductive sensor, as described hereinafter with reference to FIG. 2.

In some exemplary embodiments, the signal si can have a large dynamic range, for example, at least a factor of 10 or at least a factor of 20 between the lowest amplitude (for example, the lowest voltage) and the highest amplitude (for example, the highest voltage).

In the apparatus 11, the signal si is fed directly to a demodulator 12. In this case, the term "directly" signifies that no variable preamplification is executed for the adjustment or reduction of the dynamic range of the signal si. However, for example within the signal source 10, it is possible for a fixed amplification, or another signal processing function, to be executed. The demodulator combines the signal si with a demodulation frequency fdemod, in order to obtain a signal in a lower frequency band. Demodulation techniques of this type are known from the demodulation of communication signals, in which, for example, a radio-frequency signal is converted by a demodulator into a baseband signal. The frequency fdemod can thus correspond to an average frequency of the signal si. The demodulator 12 can be a passive demodulator.

Arranged down-circuit of the demodulator 12 is a continuous-time analog-digital converter 14, having a chopper modulator 13 at its input and a chopper demodulator 15 at its output, which respectively chop the signal in accordance with a chopper frequency fchop. Chopper techniques of this type are specifically employed for the offset compensation of an offset in the analog-digital converter 14. In the interests of simplicity, fchop and fdemod are employed hereinafter to describe both the signals and the frequency of the signals. The frequency fchop can be adjusted to the demodulation frequency fdemod. The frequency fdemod can thus be a whole-number multiple of the frequency fchop, wherein, optionally additionally, pulses, rising edges or the like of the signal fdemod can coincide with one of the pulses, rising edges and the like of the signal fchop. Additionally, the frequency fdemod can be synchronized with a clock frequency fclock (corresponding to a sampling frequency fs), at which the analog-digital converter 14 operates, such that fclock is a whole-number multiple of fdemod. This can assist in the prevention of beats.

In the context of the present application, a continuous-time analog-digital converter is an analog-digital converter which operates, not on the basis of individual sampling values at its input, but which continuously processes signals which are present at its input, at least for specific time segments. In this case, "at least for specific time segments" signifies that, in some exemplary embodiments, as described hereinafter, various inputs are processed in an alternating manner by means of multiplexing, wherein, although signals which originate from one input are only processed in specific time segments in each case, they are then converted in a continuous-time manner within these time segments. In this case, continuous-time analog-digital converters are also described as incremental converters. Hereinafter, in the interests of simplicity, the term continuous-time analog-digital converters is predominantly employed, wherein it is understood that these can also include converters which only operate in a continuous-time mode in certain time segments, and are thus, for example, incremental converters.

In some exemplary embodiments, by the employment of a passive demodulator and/or of a continuous-time analog-digital converter with chopping executed by the chopper modulator 13 and the chopper demodulator 15, an inherent low-pass filter function is achieved, such that no additional low-pass filter has to be provided. Moreover, by the combination of the continuous-time analog-digital converter 14 with the demodulator 12, it is possible for the dynamic range to be sufficiently large for the processing of the signals, and thus no amplifier with variable amplification has to be provided. The reasons for this will be described in greater detail hereinafter.

The apparatus 11 then outputs a digitized signal sdig, which can undergo further processing by subsequent circuits. If the signal source 10, for example, is a sensor, the signal sdig represents the physical variable captured by the sensor and, by the evaluation of the signal sdig, for example, control processes or regulating processes can then be executed on the basis of the physical variable.

Analog-digital converter apparatuses of this type can be employed, for example, in sensor systems which employ inductive sensors. A sensor system of this type, according to one exemplary embodiment, is represented in FIG. 2.

Figure 2:
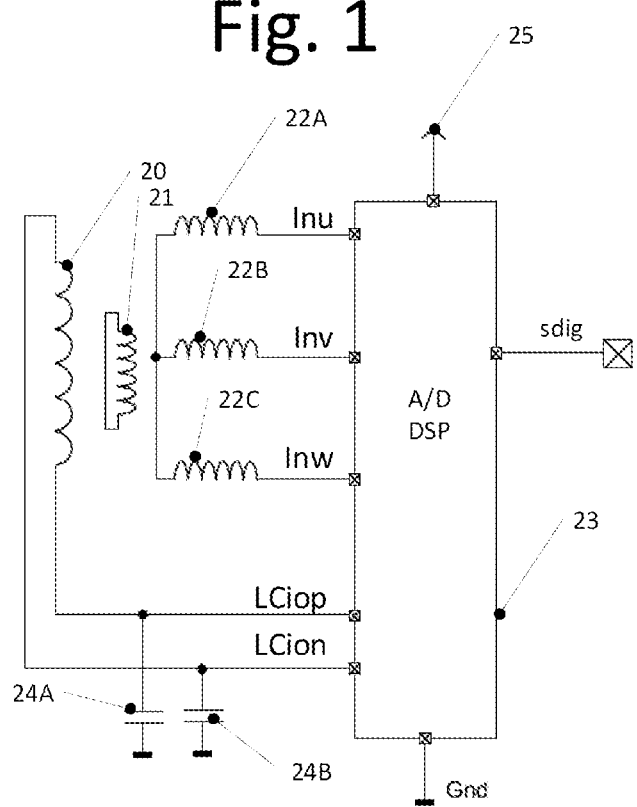
FIG. 2 shows a diagram of a system according to one exemplary embodiment.

An inductive sensor in the system according to FIG. 2 comprises an excitation coil 20, a moving inductance 21, and three receiver coils 22A, 22B and 22C. The moving inductance 21 can be executed, for example, by a slotted metal disk, which is attached to an element, the motion of which is to be measured. A rotor for example of an electric motor to which the inductance 21 is fitted can serve as one example of the system according to FIG. 2.

Output currents Inu, Inv and Inw of the receiver coils 22A, 22B and 22C are received by a control circuit 23, in which they are digitized by means of an analog-digital converter apparatus of the control circuit 23, according to one exemplary embodiment, for example, in each case the analog-digital converter apparatus 11 according to FIG. 1, or one of the analog-digital converter apparatuses described hereinafter. Additionally, the control circuit 23 comprises a digital signal processor (DSP), by means of which the digitized signals can optionally undergo further processing. The control circuit 23 further comprises an oscillator (not represented), by means of which signals LCiop, LCiun for the supply of the excitation coil 22 are output. The signals LCiop, LCiun are signals having a relatively high frequency, for example greater than 1 MHz or greater than 3 MHz, for example approximately 3.5 MHz. The feeders to the excitation coil 20, as represented, are connected to ground via capacitors 24A, 24B. The control circuit 23 is supplied by a supply voltage 25 and is coupled to ground (gnd).

In operation, the radio-frequency signal LCiop, LCiun, which is fed to the excitation coil 20, is injected into the receiver coils 22A, 22B, 22C by inductive coupling (i.e. by the action of the magnetic field which is generated by the excitation coil 20 on the receiver coils 22A, 22B, 22C). The strength of this coupling varies, according to the position of the inductance 21, for example according to the angle of rotation of a rotor to which the inductance 21 is fitted. Time-varying signals Inu, Inv and Inw are thus generated, from which the position of the inductance 21, and thus of the moving element, for example of the rotor, can be inferred. A correspondingly output signal sdig then represents the position of the moving element, for example the angular position of the rotor.

The variable coupling, in a sensor of the type represented in FIG. 2, gives rise to the comparatively large dynamic range for the signals Inu, Inv, Inw which, via corresponding input resistors, can then lead to voltage signals, for example in the range of 4 to 120 mV.

An inductive sensor of this type is employed as an example in a number of the following exemplary embodiments. However, this is not to be understood as limiting, and types of signal sources other than inductive sensors can also be employed in the exemplary embodiments described hereinafter.

Figure 3:
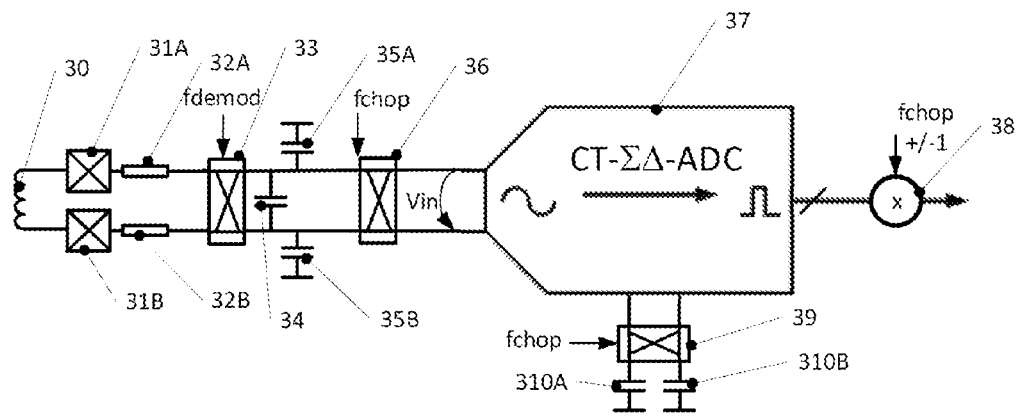
FIG. 3 shows a circuit diagram of a system according to one exemplary embodiment.

FIG. 3 shows a system according to a further exemplary embodiment.

In the exemplary embodiment according to FIG. 3, an apparatus for analog-digital conversion according to an exemplary embodiment receives a signal from a receiver coil 30 at input pads 31A, 31B. The receiver coil 30 can, for example, be one of the receiver coils 22A, 22B and 22C according to FIG. 2. The signal from the receiver coil 30 is fed via input resistors 32A, 32B to a demodulator 30, which combines the input signal with a frequency fdemod, and thus demodulates it. The frequency fdemod can be synchronized with and/or correspond to the excitation frequency of an excitation coil employed, such as the excitation coil 20 according to FIG. 2. In particular, fdemod can correspond to a frequency fLC. fLC is a resonant frequency of a LC oscillating circuit, which is formed by an excitation coil employed, such as the excitation coil 20 according to FIG. 2, in combination with external capacitances on the circuit board, e.g. 3.5 MHz. This resonant frequency, in various exemplary embodiments, is thus also employed for demodulation, that is to say fLC=fdemod. To this end, in various exemplary embodiments, a voltage zero-crossing of the sinusoidal LC oscillation of the LC oscillating circuit is considered to switch the digital fdemod-frequency, such that the frequency and phase are appropriate for demodulation.

The input resistors 32A, 32B can have, for example, resistance values between 100Ω and 1 MΩ, for example between 300 and 500Ω, for example approximately 40Ω.

A voltage value which corresponds to the demodulated input signal is then present on a capacitor 34, and is temporally averaged there. In the absence of any variation in the input amplitude of the signal received by the receiver coil 30, an average DC value is set on the capacitor 34, additionally to a superimposed residual AC voltage, as the filtering of the doubled modulation frequency (after rectification) is not particularly high. Conversely, on capacitors 310A and 310B described further below, the input signal is actually integrated.

Capacitors 35A and 35B represent capacitances to ground, including stray capacitances. In the exemplary embodiment according to FIG. 3, demodulation is thus executed as per the exemplary embodiment according to FIG. 1, with no amplification, particularly with no variable amplification. The input resistors 32A, 32B, in combination with the capacitor 34, form a RC filter, which has a low-pass response. Consequently, it is not necessary to provide any additional low-pass filter, as low-pass filtering for the filtering out of radio-frequency interference signals can be achieved in this manner.

The signal thus demodulated is then fed to a chopper modulator 36, operating at a frequency fchop which, as described above with reference to FIG. 1, is synchronized with the frequency fdemod. For example, fdemod can be a whole-number multiple of fchop. Moreover, fdemod can be equal to the above-mentioned frequency fLC.

A chopped input voltage Vin is thus provided for a continuous-time sigma-delta analog-digital converter (CT-Σ-Δ-ADC) 37. Any conventional implementation of a continuous-time sigma-delta converter can be employed in this case. In the exemplary embodiment according to FIG. 3, the continuous-time sigma-delta analog-digital converter 37 comprises an integrator, which uses capacitors 310A, 310B. These capacitors 310A, 310B are connected via a chopper 39, which is also operated at the chopper frequency fchop, to the remainder of the converter. On the capacitors 310A, 310B, for example, the integration of a current is executed which, by voltage-current conversion, integrates in the input stage of the analog-digital converter 37. This means that a DC input voltage at the input of the analog-digital converter 37 on the capacitances 310 would result in an infinitely rising integrated voltage. However, this is prevented by the digital-analog converter which is incorporated in sigma-delta analog-digital converters by means of negative feedback, as described in greater detail hereinafter, as the symbol of the voltage in the comparator, in any analog-digital conversion, is dictated by the direction of integration of the converter.

A signal output from the continuous-time sigma-delta analog-digital converter 37 is demodulated in a chopper demodulator 38 likewise at the chopper frequency fchop; for a digital signal, this corresponds to an alternating multiplication by +1 and −1.

In some exemplary embodiments, as will be described in greater detail hereinafter with reference to FIG. 8, the continuous-time sigma-delta analog-digital converter has a comparatively high input impedance, for example >100Ω, for example in the range of 250Ω, and comprises a feedback loop, as is customary in sigma-delta converters.

As output signals, for example, a 6-bit signal with an output frequency of 10 MHz can be output, wherein other bit widths and frequencies are also possible.

The mode of operation of the demodulator 33 and the capacitance 34 will now be described with reference to FIGS. 4 and 5.

Figure 4:
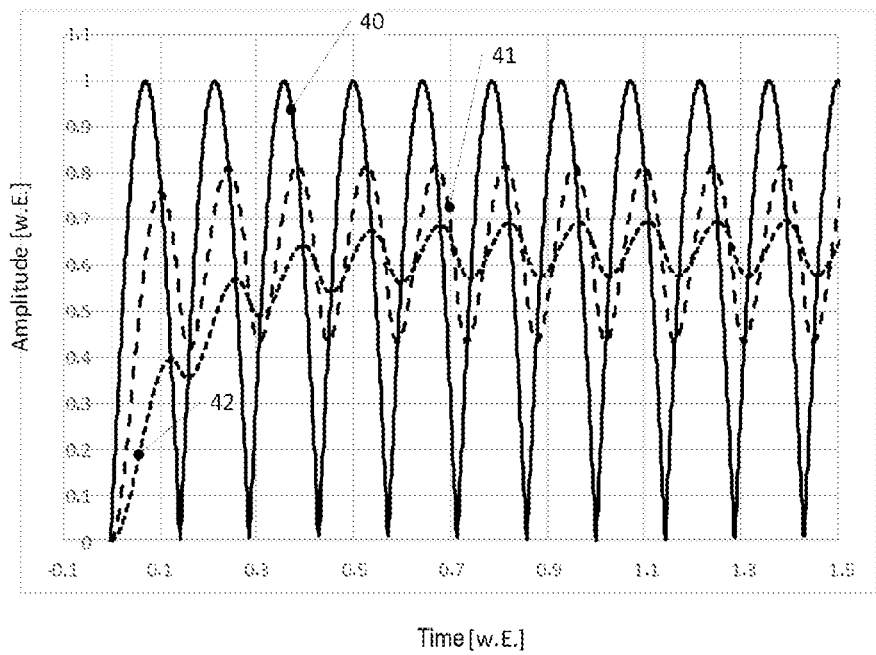
FIG. 4 shows exemplary signals for the illustration of the mode of operation of some exemplary embodiments.

FIG. 4 shows the input signal for the chopper modulator 36 for various filter settings of the low-pass filter formed by the resistors 32A, 32B and the capacitor 34. 3.5 MHz has been assumed as the modulation frequency of the input signal (corresponding to the frequency of the signal LCiop, LCion fed to the excitation coil 20 according to FIG. 2).

The curve 40 shows a signal with no capacitance 34, i.e. with no low-pass filtering. A curve 41 shows a signal with a low-pass filter transition frequency of 3.5 MHz, and a curve 42 shows an exemplary signal with a transition frequency of 1 MHz. A constant signal amplitude from the receiver coil 30 has been assumed. As can be seen, in the event of filtering, the signal oscillates around a stationary value, which corresponds to the signal value which is to be converted.

Figure 5:
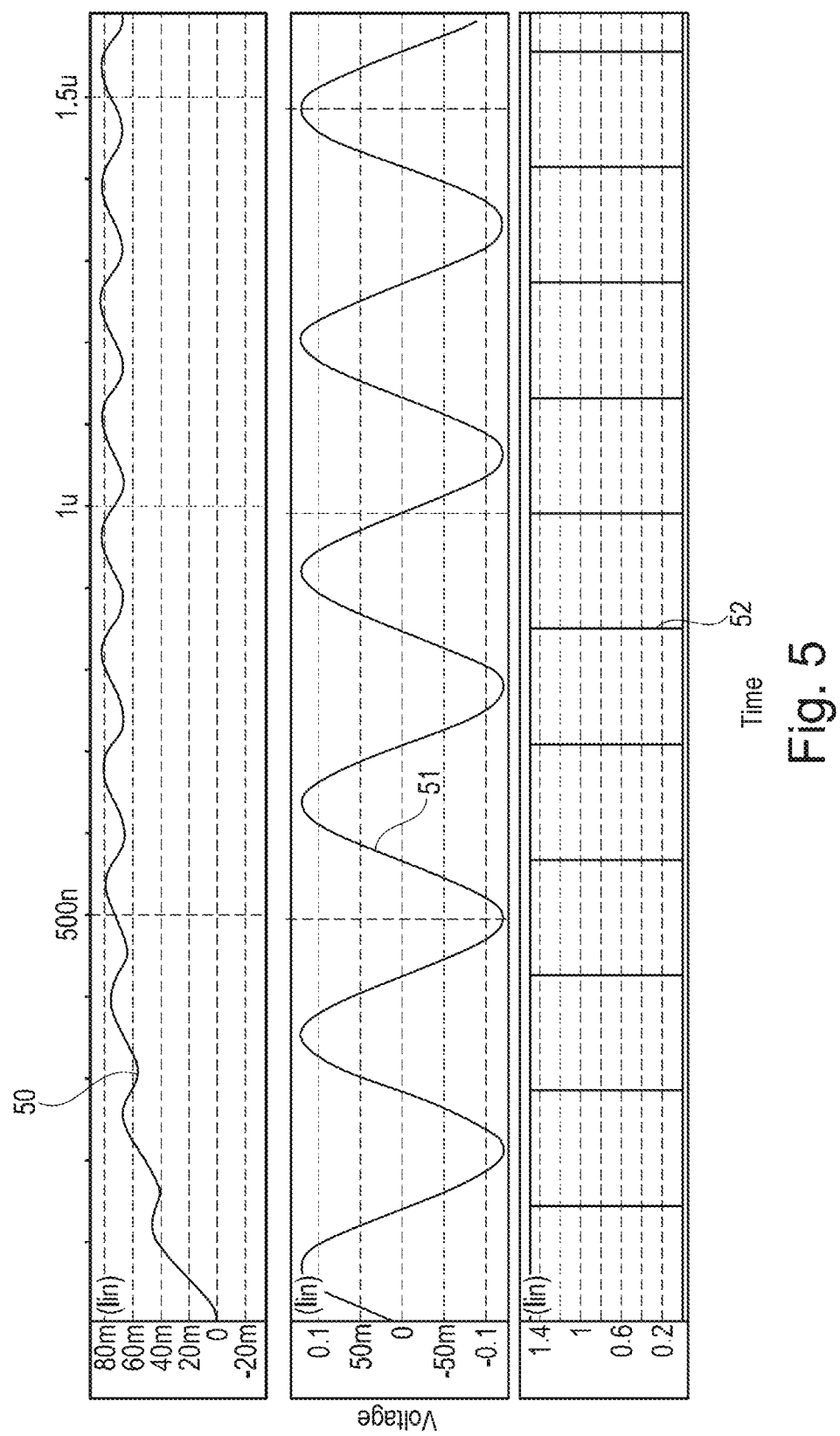
FIG. 5 shows exemplary signals for the illustration of the mode of operation of some exemplary embodiments.

The demodulation is further illustrated in FIG. 5. In FIG. 5, a curve 51 shows an example of an input signal for the demodulator 33, i.e. for a signal delivered by the receiver coil 30. A curve 52 shows an example of the signal at the frequency fdemod, which is fed to the demodulator 33. A curve 50 shows an input signal for the chopper 36 which has been generated by demodulation with filtering by the capacitor 34 and the resistors 32A, 32B.

Hereinafter, the advantages and effects of the use of a continuous-time analog-digital converter, such as the continuous-time sigma-delta analog-digital converter 37 according to FIG. 3, are described in comparison with an analog-digital converter which employs switched capacitors for the scanning of an input signal and thus does not operate in a continuous-time mode. By way of illustration, FIG. 6 shows a schematic circuit diagram of an input stage of a continuous-time analog-digital converter, and FIG. 7 shows a schematic circuit diagram of an input stage of an analog-digital converter with a switched input capacitor.

Figure 6:
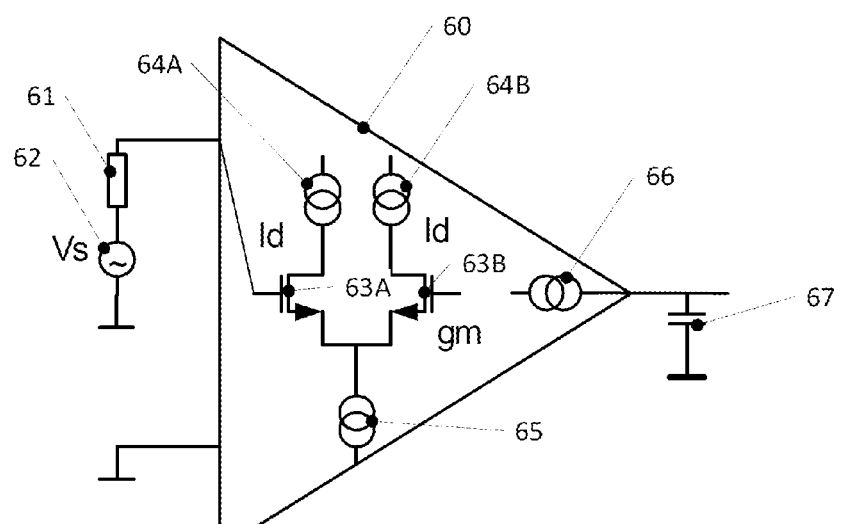
FIG. 6 shows a schematic circuit diagram of a continuous-time analog-digital converter for the clarification of some exemplary embodiments.
Figure 7:
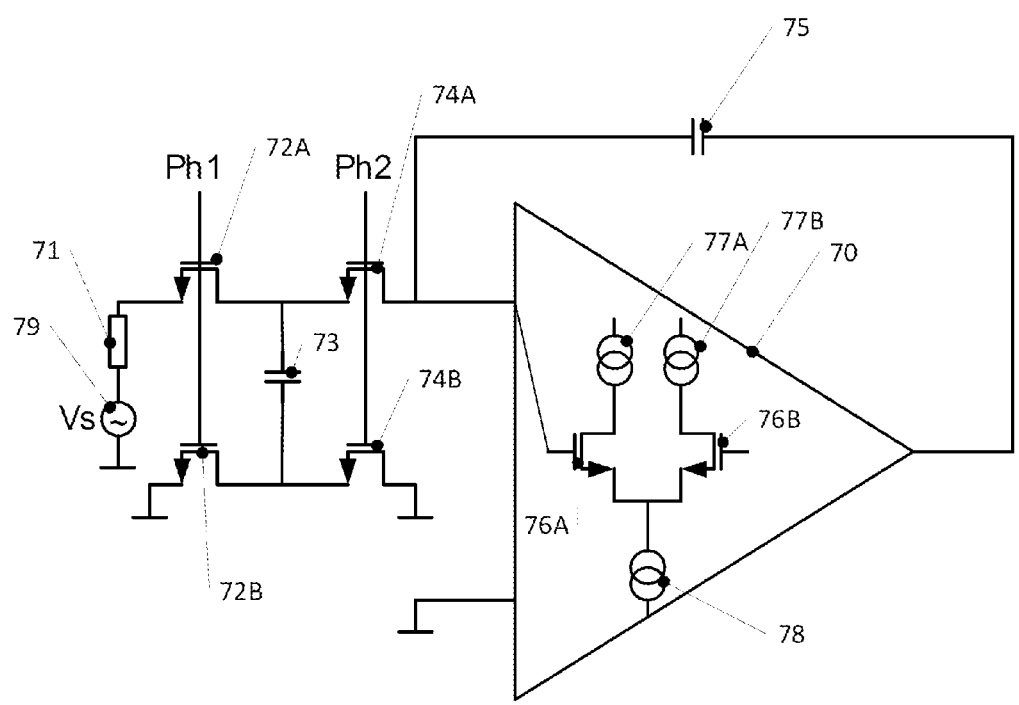
FIG. 7 shows a simplified circuit diagram of an analog-digital converter with a switched input capacitor as a comparative example with FIG. 6.

In FIG. 6, a voltage source 62 represents the generation of an input voltage Vs for the converter. This is fed to an input amplifier 60, which has a transconductance gm. The input amplifier 60 is represented by a transistor pair 63A, 63B, current sources 64A, 64B which respectively generate a current Id, a current source 65 and a current source 66, which outputs the output signal of the amplifier 60. This representation is to be understood as schematic only. The output signal is integrated in an integration capacitance 67, which has a value Cint.

For the generation of low noise, the inverse transconductance must be 1/gm< the resistance value Rs of the input resistor 61. Thus, for example, in order to achieve a noise figure NF of +1 dB, it is necessary for the transconductance of the input stage to observe the following relationship:

$$\frac{1}{gm} < \approx 1/2 \; Rs$$

For the optimization of the noise, the transistors 63A, 63B must be operated in weak inversion, in order to achieve the best possible ratio of gm to the current Id. In this case, 1/gm is as follows:

$$\frac{1}{gm} = \left(\frac{kT}{q}\right)\frac{n}{0.7}\frac{1}{Id} \approx \frac{55 \; \text{mV}}{Id}$$

where n, as the technology-dependent factor by which the transistors are operated below the limit of the threshold value (i.e. in weak inversion), has been set to 1.4, Id is the current through the transistors 63A, 63B, k is the Boltzmann constant, T is the absolute temperature and q is the elementary charge. Room temperature has been assumed as the temperature T on the right-hand side of the expression. For an input resistance Rs of 1 kΩ, Id must then be greater than approximately 110 µA which, for an input stage of a continuous-time sigma-delta analog-digital converter or an amplifier, by corresponding design, is relatively easy to achieve.

FIG. 7 shows an input stage of an analog-digital converter having an input capacitor 73. An input voltage Vs is delivered by a voltage source 79 via an input resistor 71. In a first operating phase, transistor switches 72A, 72B are closed in a manner controlled by a signal Ph1 such that, according to the input voltage, the input capacitor 73 is charged, whereas transistor switches 74A, 74B are open in a manner controlled by a signal Ph2. In a second phase, the transistor switches 72A, 72B are then open, and the transistor switches 74A, 74B are open, such that the charge is transmitted to an input of an amplifier 70. The amplifier 70, similarly to the amplifier 60 according to FIG. 6, comprises an input transistor pair 76A, 76B with associated current sources 77A, 77B, 78. An output signal of the amplifier 70 undergoes further processing (not represented), and is fed back via a capacitor 75 to an input of the amplifier 70. Again, the representation according to FIG. 7 is to be understood as schematic only.

In a converter of this type, the dimensioning of a capacitance Cin of the input capacitor 73 is a challenge insofar as that conflicting requirements apply in this instance. On the one hand, the capacitance Cin must be selected to be sufficiently small, such that a transient recovery of the converter is required. In order to fulfil the Nyquist criterion, the sampling frequency fs, corresponding to a clock frequency fclock which is employed for the purposes of sampling and on which the signals Ph1, Ph2 are based, must be substantially greater than the bandwidth of the signal which is to be modified. In order to ensure correct transient recovery during a scanning period, within a time interval Ts/2, wherein Ts is the inverse of an employed clock signal fclock (which, as described above, is equal to the sampling frequency fs, i.e. Ts is thus also the inverse of the sampling frequency fs), a multiple of a time constant must be $\tau=Rs\times Cin$, wherein Rs is the resistance value of the input resistor 71. For example, for 12 bit resolution, 8.4 $\tau$ within Ts/2 is required, or 5.6 $\tau$ for 8 bit resolution.

This gives the following:

$$NF(12\text{bit}) = 20 \cdot \log10\left(\sqrt{(1+2\cdot 8.4)}\right) = 12.5 \text{ dB}$$

$$NF(8\text{bit}) = 20 \cdot \log10\left(\sqrt{(1+2\cdot 5.6)}\right) = 10.9 \text{ dB}$$

Cint is the capacitance value of the capacitor 75 according to FIG. 7. This results in a 16.8-times higher noise contribution of the impedance of the capacitors, independently of the clock frequency or the power infeed to the input transistors 76A, 76B.

The noise figure NF for a 12-bit signal is limited to:

$$8.4 RsCin \leq 1/2 \; Ts = 1/(2 fclock)$$

$$Cint \leq 1/(2 \times fclock \; Rs)$$

$$Rnoise\_equi = 1/(fclock \; Cint) \geq 16.8 \; Rs$$

This means that, using a continuous-time analog-digital converter as employed in the exemplary embodiments, a three- to four-times lower noise level can be achieved than in the case of converters operating with switched capacitors.

Moreover, processing with continuous-time analog-digital converters can permit the management of effects by signal convolution (aliasing), as can occur in analog-digital converters which employ a sampling function, for example, using switched capacitors, as represented in FIG. 7. This can reduce noise and mirror frequencies by signal convolution, and expand a dynamic range to form signals of lower amplitudes. Mirror frequencies occur when signals with frequencies outside the useful frequency range are reflected in the useful frequency range in an unwanted manner. Thus, for example, an input interference signal of 3×fdemod+4 kHz, after demodulation, will be visible as an additional unwanted 4 kHz signal. Effects of this type can be reduced in the case of the exemplary embodiments.

As described above, continuous-time analog-digital converters do not require a multiple of the above-mentioned time $\tau$ within Ts/2 in order to achieve transient recovery. This reduces the bandwidth required for transient recovery and thus the noise and the requisite power, since, the greater the requisite bandwidth, the greater the electric power required for the achievement of a necessary speed for transient recovery.

The employment of choppers in conjunction with a continuous-time analog-digital converter can additionally reduce an offset by one to three orders of magnitude. Moreover, this combination can reduce flicker noise, which rises at lower frequencies and is generated by active electronic circuits and chopped resistors. Additionally, in some exemplary embodiments, even-number harmonic distortion can be reduced.

In continuous-time sigma-delta converters, it is also possible for the dynamic range to be extended upward, as described further below, by means of multi-bit feedback or by means of feedback loops, in order to compensate offset ripple. As a result of the extended dynamic range in various exemplary embodiments, no amplifier with variable amplification is required, and direct passive demodulation can be executed using the demodulator 12 according to FIG. 1 or the demodulator 32 according to FIG. 3, without the necessity for a variable amplifier of this type. In some exemplary embodiments, this can reduce an offset which can be generated by an amplifier of this type, can reduce transient recovery issues and/or can reduce the noise in the case of some exemplary embodiments.

Moreover, in some exemplary embodiments, the combination of the input resistors 32A, 32B and the capacitor 34 can be employed as a filter against electromagnetic interference (EMC filter, electromagnetic compliance), and can eliminate intermodulation issues which would occur as a result of non-linearities in active switches, such as gains. The input resistors 32A, 32B can additionally be employed for protection against electrostatic discharges (ESD protection). In the case of continuous-time converters, the input resistors can thus be effectively adapted to conditions of noise, and signal processing can be easily adjusted to an exacting noise figure, for example only an additional +1 dB, as described above.

The oscillations shown in FIG. 4, as represented, can firstly be reduced by the low-pass properties of the continuous-time converter. At higher low-pass frequencies, an oscillation remains, the frequency of which is primarily determined from the clock frequency of the analog-digital converter fclock, minus the above-mentioned frequency fLC.

If the frequency fADC is synchronized with fLC, this oscillation can also be reduced.

FIG. 8 shows a further exemplary embodiment of an apparatus according to one exemplary embodiment. Elements corresponding to elements which have already been described with reference to FIG. 3 carry the same reference symbols, and are not described in greater detail again. In FIG. 8, specifically, a non-limiting example of a layout of the continuous-time sigma-delta analog-digital converter 37 according to FIG. 3 is represented.

The analog-digital converter according to FIG. 8 comprises a voltage/current converter 80 (e.g. a transconductance amplifier), in which a feedback signal of the analog-digital converter is fed back via an input resistor 81. Output currents of the voltage/current converter 80 undergo analog integration by means of capacitors 310A, 310B. In this case, for example, the capacitors 310A, 310B can be executed by means of gate oxides.

The current signal thus integrated is fed to a comparator 82. An output of the comparator is fed to the chopper demodulator 38 which, in this case, is arranged within the loop of the sigma-delta converter but which, in this arrangement, also executes the chopper demodulation of the output signal. The output signal of the comparator 82, which corresponds to a +1 or a −1, is fed to a digital integrator 83. This corresponds to a counter, which counts upward if the output signal of the comparator 82 corresponds to a +1, and counts downward if the output signal of the comparator 82 corresponds to a −1.

Moreover, by means of a counter 85, the output signal, increased by +1, of the comparator 82 is added to an output signal of the integrator 83 in an adder 84. The adder 84 is in this case a digital summation point, which adds the digitally integrated value from the integrator 83 to the "faster" "proportional" or "forward" value of the comparator via 85. A summation of a rapid immediate value from 85 is thus executed with a value from the integrator 83, which is delayed by integration. The path via 85 can be understood as a stabilizing proportional forward path, similar to that e.g. in PID controllers, or to a stabilizing zero-point in the Bode diagram of feedback systems. In the absence of the path 85, in some applications, unwanted oscillations may occur.

In this manner, a thermometer-encoded digital signal is generated, which represents the input voltage Vin on the voltage/current converter 80. This signal can be converted by a thermometer/binary encoder 86 into a binary output signal. The thermometer-encoded signal can be, for example, a 64-bit thermometer-encoded signal.

The thermometer-encoded signal is additionally fed back via a digital-analog converter 87 in the form of a feedback signal to the voltage/current converter 80. The digital-analog converter 87, in the exemplary embodiment represented, is a multibit digital-analog converter, which feeds back the thermometer-encoded 64-bit signal. By means of multibit digital-analog converters of this type, a dynamic range of the sigma-delta analog-digital converter in some exemplary embodiments can be expanded.

The implementation in the form of a sigma-delta analog-digital converter is to be understood as an example only; other converters, such as SAR converters (successive approximation register converters), tracking ADCs, or other continuous-time converters can also be employed.

Whereas, in FIG. 8, only a single voltage/current converter 80 is represented, other exemplary embodiments may also provide a plurality of voltage/current converters 80 which, optionally, can be connected in parallel. Particularly in the event of small input signals, this can increase the transconductance, and thus reduce the noise. In some exemplary embodiments, parallel connection can only be executed in the case of small input signals, e.g. having a voltage or current level below a predefined threshold value whereas, in the event of larger input signals, only a voltage/current converter is employed. As a result, in combination with the chopping described in some exemplary embodiments, even in the event of small input signals, a corresponding amplification can be achieved, with no significant offset and linearity errors being generated as a result.

In some applications, such as the inductive sensor according to FIG. 2, it is necessary to undertake the analog/digital conversion of multiple input signals, in the case according to FIG. 2, three input signals Inu, Inv, Inw.

To this end, in some exemplary embodiments, an apparatus as represented in FIG. 3 or in FIG. 8 can be provided for each input signal. In other exemplary embodiments, a single analog-digital converter apparatus can be provided which, by means of a multiplexer 90, processes the various input signals in an alternating manner. An example of an apparatus of this type is represented in FIG. 9.

In the exemplary embodiment according to FIG. 9, a signal of an inductive sensor, for example of the inductive sensor according to FIG. 2, is processed, which comprises three detection coils 30A, 30B and 30C. The detection coil 30A is connected to input pads 31A, 31B of the analog-digital converter apparatus represented, the detection coil 30B is connected to input pads 31C, 31D, and the detection coil 30C is connected to input pads 31E, 31F. The input pads 31A to 31F are connected to a multiplexer 90, which is designed to select signals from one of the detection coils 30A to 30C for further processing.

The multiplexer 90 is operated at a frequency fADC, which determines the time intervals at which a switchover between the signals from the various detection coils 30A to 30C is executed.

The selected signal is fed to a demodulator 92, the function of which corresponds to the demodulator 33 according to FIG. 3, wherein a corresponding demodulation signal at the frequency fdemod is fed in from an oscillator device 91. Down-circuit of the demodulator 92, a low-pass filter 93 is represented which, as in the previously discussed exemplary embodiments, can also be formed by input resistors (for example, 32A, 32B according to FIG. 3) and a capacitance (for example, 34 according to FIG. 3). An output of the low-pass filter 93 is connected to an input of an incremental analog-digital converter 95. The incremental analog-digital converter is essentially a continuous-time converter which, however, only operates in a continuous-time mode in segments, namely, in segments during which the input signal from a detection coil 30A to 30C is processed respectively. The incremental analog-digital converter 95 comprises a chopper modulator 96 at its input and a chopper demodulator 97, which is represented here at the output but which, as represented in FIG. 8, can also be arranged within the converter.

As an incremental analog-digital converter 95, the above-mentioned converter types can be employed. For example, a SAR converter can be employed in combination with a tracking ADC.

Combinations of various converters are also possible. The low-pass filter 93 can also be an inherent low-pass filter of the analog-digital converter 95.

The low-pass filter and the incremental analog-digital converter are reset in accordance with the frequency fADC at which the multiplexer 90 is operated such that, for each segment in which the signal from one of the detection coils 30A to 30C is processed, a "new start", in a manner of speaking, is executed. A preceding value can be fed to the incremental analog-digital converter 95 as a starting value, which corresponds to an end value of a preceding time segment for the respective receiver coil. Alternatively, prev can also be a predicted value, which is derived from a preceding characteristic. This is described with reference to FIG. 13.

Figure 13:
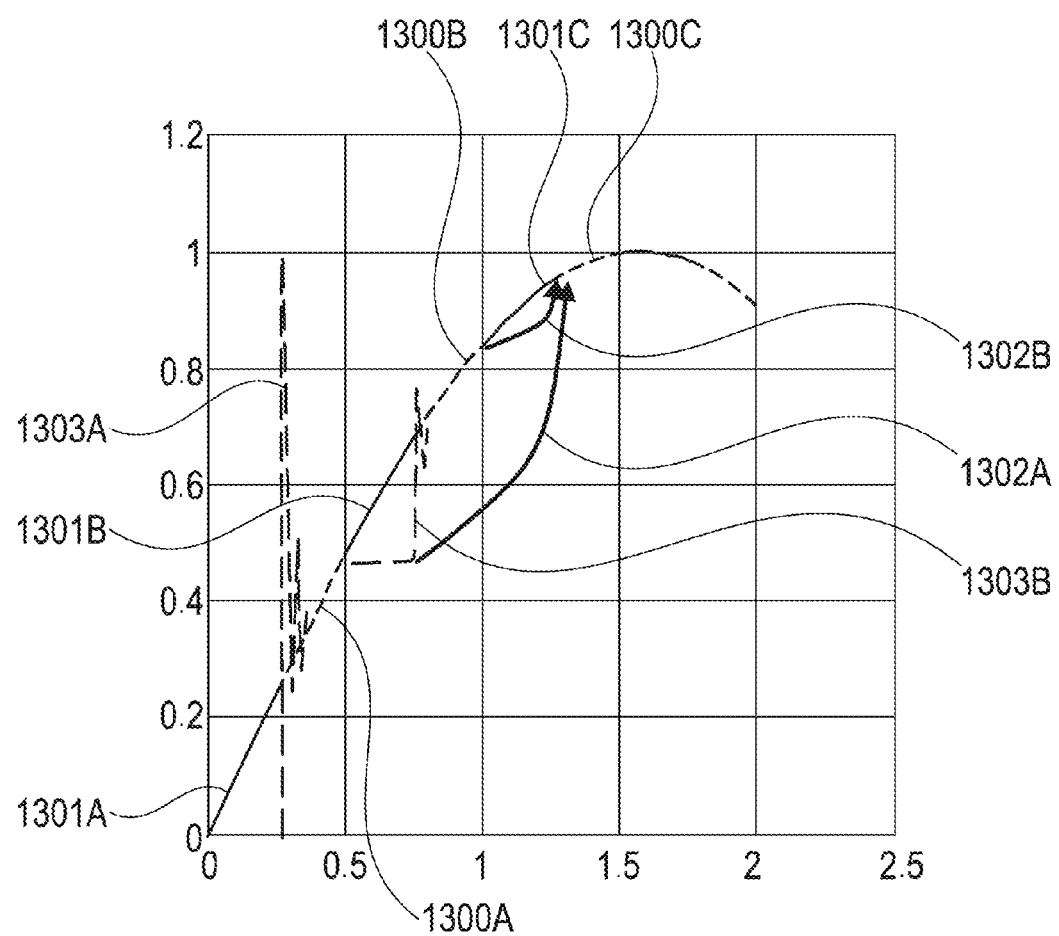
FIG. 13 shows a diagram for the illustration of the prediction of a subsequent starting value.

FIG. 13 shows a curve having curve segments 1300A-C and 1301A-C and a characteristic of an input signal which is to be digitized. In the segments 1300A, 1300B and 1300C, the corresponding input signal is fed to the analog-digital converter (for example, the input signal is a signal generated by the receiver coil 30A and is selected by means of the multiplexer 90), whereas, in the segments 1301A, 1301B and 1301C, no digitization is executed (for example, on the grounds that the signal from another receiver coil is selected by the multiplexer 90). At the start of the segment 1300A, as indicated by reference symbol 1303A, a transient recovery process is required, for the transient recovery of the digital output signal to the correct value. If, as represented for the segment 1300B, the value at the end of the segment 1300A is employed as a starting value, a transient recovery process is also required, as indicated by reference symbol 1303B. Consequently, in some exemplary embodiments, predictive techniques are employed, as indicated by arrows 1302A and 1302B. In this case, not only the end value of the preceding segment is considered, but also a characteristic in one or more preceding segments. For example, in a simple case, an average gradient in the preceding segments can be employed for the adjustment of a characteristic, and thus of a starting value. In other exemplary embodiments, predictive techniques can be employed. For example, a linear, quadratic or sinusoidal fit curve can be applied to preceding segments, and a starting value defined herefrom.

As a further alternative, an analog-digital converter can be switched between different operating modes or types of analog-digital converters. For example, at the start of each segment 1300A, 1300B, 1300C, a SAR analog-digital conversion can be executed initially, in order to rapidly establish a corresponding starting value and then, for example, the value can be tracked using a sigma-delta converter, in order to map variations in the input value.

Again, with reference to FIG. 9, a range selection device 94 can further be provided, by means of which, using a signal RF, an input range for the incremental converter 95 can be selected, for example by the setting of a reference value. In this manner, a range in which input signals can be converted can be expanded. This selection of an input range is achieved, as represented, by means of an additional input of the incremental converter 95, and not, as in some conventional solutions, by means of an error-prone supplementary circuit arranged up-circuit of the input stage of the incremental converter 95, such as an amplifier with variable amplification. Thus, in some exemplary embodiments, for example, offset errors can be reduced, and unavoidable offset, noise and transient recovery processes of up-circuit chopped or non-chopped amplifiers are eliminated.

Such a range switchover can be achieved in a simple manner by means of a transconductance switchover of the input stage of the incremental converter 95. The voltage-current conversion in the input stage can thus be switched over by factors. Additionally, or alternatively, the full-scale range of a digital-analog converter in a feedback path of the incremental converter 95 (see preceding exemplary embodiments) or a reference for the digital-analog converter can be switched over. This also results in a scale adjustment of LSB/V (least significant bit per volt of input voltage) on the output of the incremental converter 95. Although this range selection function has been discussed with reference to the incremental converter 95 represented in FIG. 9, it can also be provided in the continuous-time converters according to the other exemplary embodiments described herein.

Figure 10:
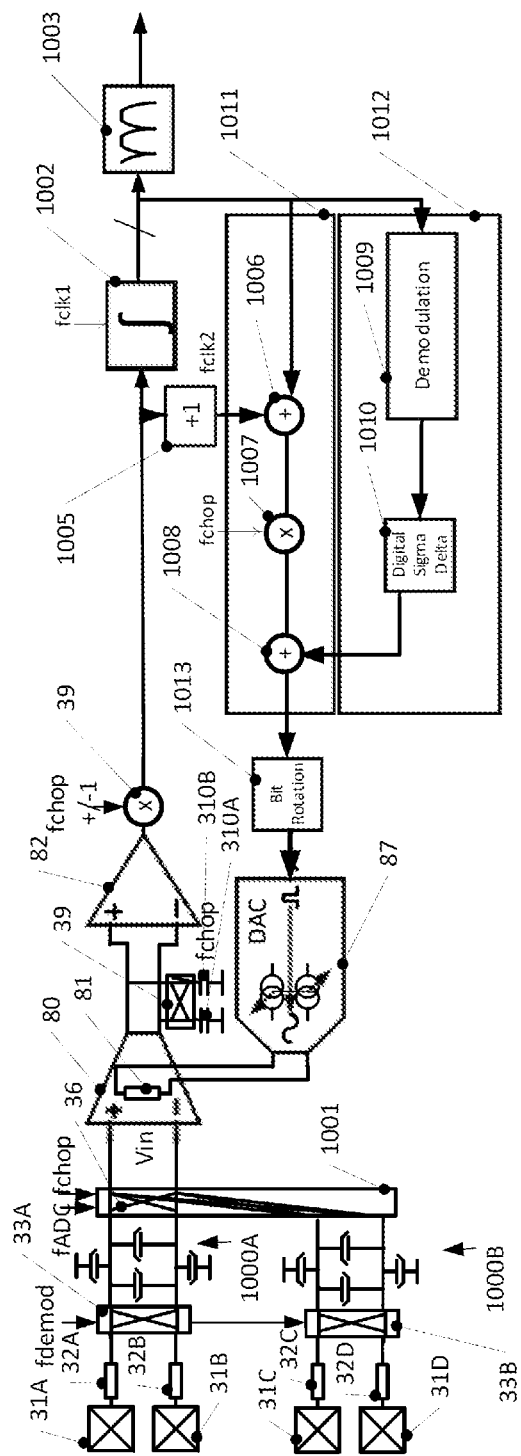
FIG. 10 shows a circuit diagram of a system according to one exemplary embodiment.

The provision of a chopper modulator and a chopper demodulator can result in the generation of chopper ripple in an output signal. Ripple of this type can be compensated by means of feedback paths. A corresponding exemplary embodiment is represented in FIG. 10. Again, components which have already been described with reference to the preceding figures are identified by the same reference symbols, and are not described in detail again.

A first input signal is fed in via input pads 31A, 31B, and is fed from there via input resistors 32A, 32B to a demodulator 33A, which operates at a frequency fdemod and corresponds to the demodulator 33 of FIG. 3. Down-circuit of the demodulator 33A, a capacitor assembly 1000A is arranged, the function of which corresponds to the capacitor 34 and the capacitors 35A, 35B according to FIG. 3.

In a corresponding manner, a second input signal can be fed via pads 31C, 31D and input resistors 32C, 32B to a demodulator 33B, down-circuit of which a capacitor assembly 1000B is arranged.

The signals thus processed are fed to a combined multiplexer and chopper modulator, wherein the multiplexer function is identified by the reference symbol 1001 and the chopper modulator function, as per FIG. 3, is identified by the reference symbol 36. The function of the chopper modulator is essentially a multiplication by +1 or −1, which corresponds to an optional reversal of the inputs. For the additional integration of a multiplexer function, this reversal can be extended to all inputs (in the case according to FIG. 10). This means that, when the signal fed via the pads 31A, 31B is processed, the signal is ultimately fed, with the same or reversed polarity (interchanged conductors) to a voltage/current converter 80 which corresponds to the voltage/current converter 80 according to FIG. 8 and, when the signal fed to the pads 31C, 31D is processed, these corresponding signals are fed either directly or in a reversed arrangement to the voltage/current converter 80.

The multiplexer is operated at a frequency fADC corresponding to FIG. 7, and the modulator (i.e. the interchanging of the conductors) at a frequency fchop.

The signals are then converted using a continuous-time sigma-delta analog-digital converter, the layout of which firstly corresponds to that represented in FIG. 8, and mutually corresponding elements have the same reference symbols. An integrator 1002, which is operated at a frequency Fclk1, essentially corresponds to the integrator 83 according to FIG. 8 and can be implemented, for example, in the form of an up-counter/down-counter. The elements 84 and 85 from FIG. 8 can also be provided here. In the exemplary embodiment according to FIG. 10, a notch filter 1003 is additionally provided on the output.

Conversely to the exemplary embodiment according to FIG. 8, the exemplary embodiment according to FIG. 10 comprises two feedback paths 1011, 1012, which ultimately generate the feedback signal which is fed to the digital-analog converter 87.

The first feedback path 1011, with respect to its function, essentially corresponds to the feedback arrangement according to FIG. 8, wherein an addition 1005 corresponds to the addition 85 and an adder 1006 corresponds to the adder 84, such that a thermometer-encoded signal is present on an output of the adder 1006. This signal is chopped in a chopper modulator 1007 at the chopper frequency fchop, and is fed to an adder 1008.

The second feedback path 1012 comprises a demodulation device 1009 together with a digital sigma-delta modulator 1010. The demodulation 1009 executes a two-phase demodulation on the basis of the chopper frequency and, in combination with the digital sigma-delta modulator 1010, generates an offset signal, for example a four-bit offset signal, which at least partially compensates ripple by chopping. This technique is known per se. Accordingly, the signal fed to the digital-analog converter 87 still contains a component which compensates ripple by chopping.

Optional bit-rotation 1013 can additionally reduce offsets by means of dynamic element matching techniques. Bit-rotation is one of many options which are known per se for the equalization of the non-linearity of converters by temporal averaging. Other conventional methods can also be employed for this purpose.

Techniques of this type can also be employed at another stage. One exemplary embodiment, which employs dynamic element matching of this type will now be described with reference to FIG. 11.

In this case, for example, a reference current, an amplifier or a resistance of a sensing resistor 81 can be restricted for the purposes of range selection.

Figure 11:
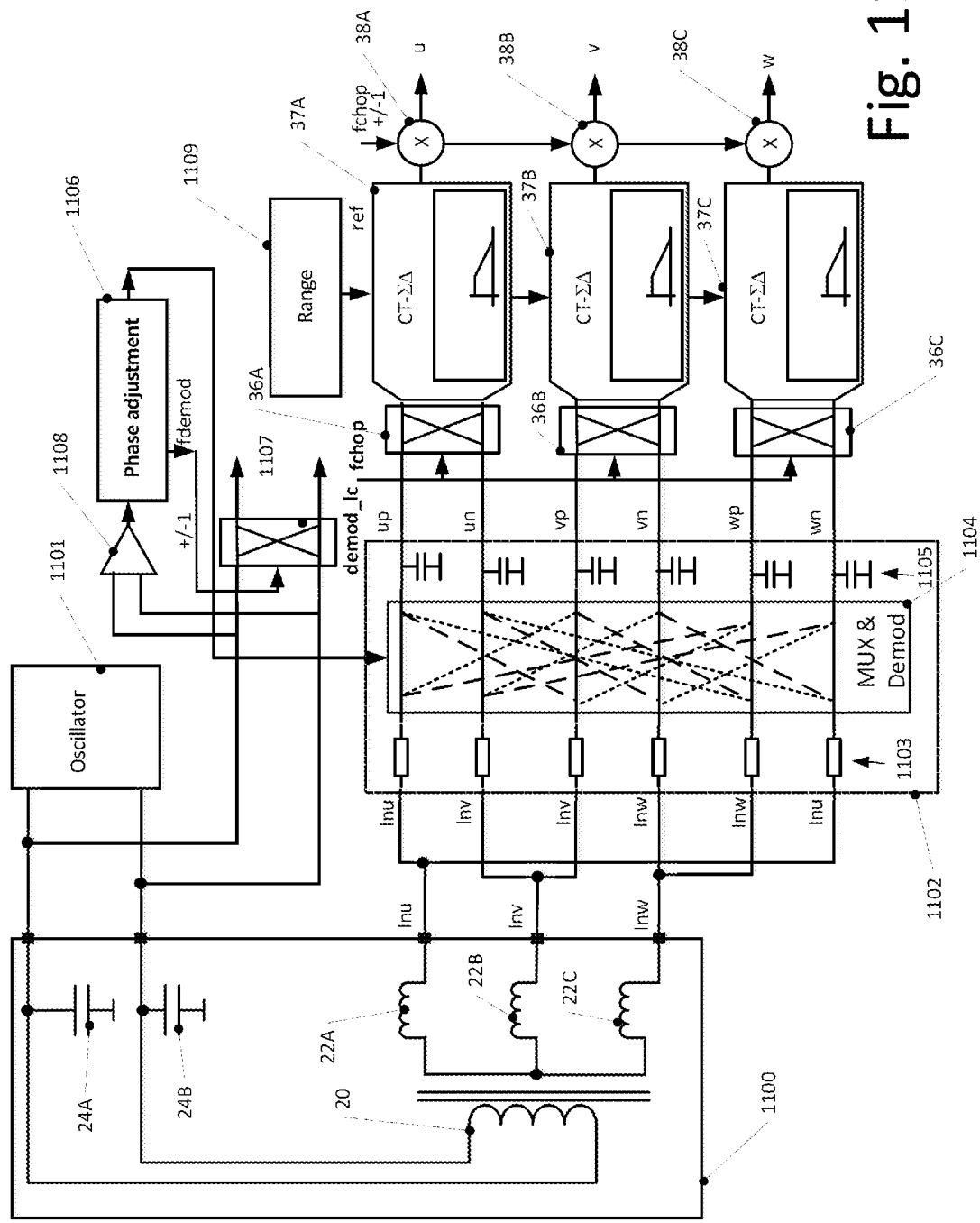
FIG. 11 shows a circuit diagram of a system according to one exemplary embodiment.

In the exemplary embodiment according to FIG. 11, the above-mentioned receiver coils 22A, 22B and 22C and also an excitation coil 20 are provided. The inductance 21 is not represented, and is only indicated in FIG. 11 by a transformer coupling symbol.

The excitation coil 20 is supplied by an oscillator 1101 with an excitation signal, wherein the above-mentioned capacitors 24A, 24B are provided on the conductors from the oscillator 1101 to the excitation coil 20. The excitation coil 20, the receiver coils 22A to 22C and the capacitors 24A, 24B can be provided, for example, on a circuit board 1100.

The output signals Inu, Inv and Inw, as represented, are fed to a filtering/demodulation assembly 1102. The device 1102 comprises an assembly of input resistors 1103, wherein two input resistors are assigned to each channel (LN0, LN1, LN2), the function of which input resistors corresponds to that of the input resistors 32A, 32B according to FIG. 8. Down-circuit of the input resistor assembly 1103, a multiplexer and demodulation assembly 1104 is arranged, which is controlled by a frequency fdemod and firstly executes the function of the demodulator 33 according to FIG. 3. Additionally, the multiplexer and demodulator assembly 1104 switches the corresponding input channels (LNu, LNv, LNw) to corresponding output signals UP, UN; VP, VN; WP, WN. This may take place using a fixed assignment. However, the assignment can also change, in order to achieve dynamic element matching.

A capacitance assembly 1105 is arranged down-circuit of a capacitor assembly 1105 on the output of the multiplexer and demodulator assembly 1104, the function of which capacitance assembly corresponds to the capacitors 34, 35A, 35B according to FIG. 3 or to the capacitor assemblies 1000A, 1000B according to FIG. 10. For each pair of output signals (UP, UN; VP, VN; WP, WN) of the assembly 1102, a dedicated digitization path is then provided. In this case, accordingly, conversely to the multiplexer processing according to FIGS. 9 and 10, parallel processing is executed. In general, this requires a large chip surface but, for an equivalent implementation of the analog-digital converters and an equal clock pulse, is faster, as all the signals are converted in parallel.

Each path comprises a chopper modulator 36A, 36B, 36C, a continuous-time sigma-delta analog-digital converter 37A, 37B, 37C and a digital chopper demodulator 38A, 38B, 38C, the functions of which correspond to the corresponding elements 36, 37, 38 in FIG. 3. Each continuous-time sigma-delta analog-digital converter 37A, 37B, 37C, in the manner of the continuous-time sigma-delta analog-digital converter 37 according to FIG. 3, can comprise integrating capacitors which, by means of a chopper, are connected to the remainder of the converter, as the elements 39, 310A and 310B according to FIG. 3. In FIG. 11, these are not represented separately. The chopper frequency fchop, as already described above, can be synchronized with the demodulator frequency fdemod.

The demodulator frequency fdemod is moreover synchronized with the excitation frequency which is fed to the excitation coil 20. Additionally, between the respective elements 36A to 36C, 37A to 37C and 38A to 38C, in some exemplary embodiments, dynamic element matching can be executed, such that the signals in one channel can be processed using various combinations of chopper modulator, continuous-time sigma-delta analog-digital converter and chopper demodulator. Digital output signals u, v and w can then undergo further processing. As for the incremental analog-digital converter 95 and the range selection 94 described with respect hereto, for each of the continuous-time analog-digital converters 37A, 37B and 37C, a range selection can also be provided, identified here by the reference symbol 1109.

For the generation of the signal fdemod, the signal is fed from the oscillator 1101 through a phase comparator 1108 to a phase adjustment device 1106, which then generates the signal fdemod in a manner synchronized with the output signal of the oscillator 1101. Moreover, the oscillator signal itself can be demodulated by a demodulator 1107. An output signal of the demodulator 1107 can then be employed to determine the amplitude of the oscillator signal. By means of the amplitude measurement, as described above, the frequency fdemod can be determined on the basis of zero-crossings of the oscillation at the frequency fLC by way of the excitation coil 20 and stray capacitances.

The resistor assembly 1103 and the capacitor assembly 1105 in turn, in combination, can form a low-pass filter function. The resistor assembly 1103 can moreover be employed for protection against electrostatic discharges (ESD protection).

Dynamic element matching of this type can be executed during operation, during an initial calibration or during a run-up of the apparatus.

Figure 12:
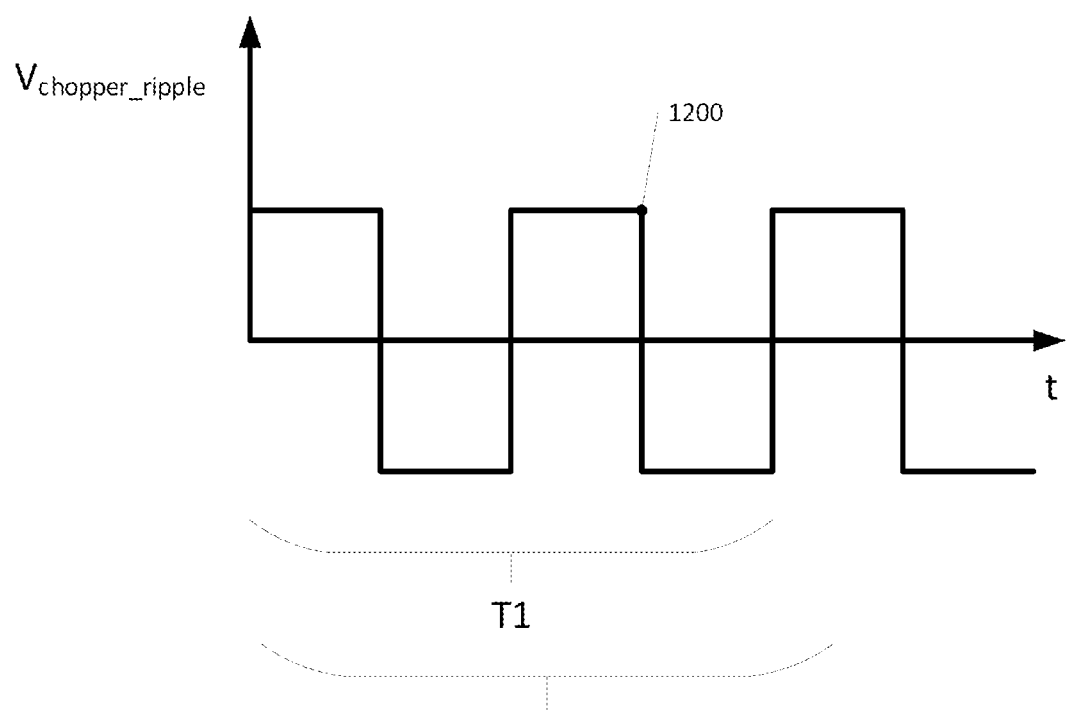
FIG. 12 shows a diagram with signals for the illustration of some exemplary embodiments.

In addition to the provision of a feedback path, such as the feedback path 1012 according to FIG. 10, for the reduction of ripple, this can also be achieved, additionally or alternatively, in an apparatus operating with a multiplexer (for example, the embodiments according to FIGS. 9 and 10) by the synchronization of the frequency fADC with the chopper frequency fchop. This is illustrated in FIG. 12. If the frequency fADC is a whole-number multiple of the chopper frequency, this means that the integration of the signal, including a chopper ripple, which is symbolized in FIG. 12 by a curve 1200, is executed over a whole number of periods of the chopper ripple, illustrated in FIG. 12 by an integration period T1. As a result, the positive and negative contributions of the ripple can be substantially averaged out. If this condition is not the case, as illustrated in FIG. 12 by a period T2, the ripple is not averaged out.

Figure 14:
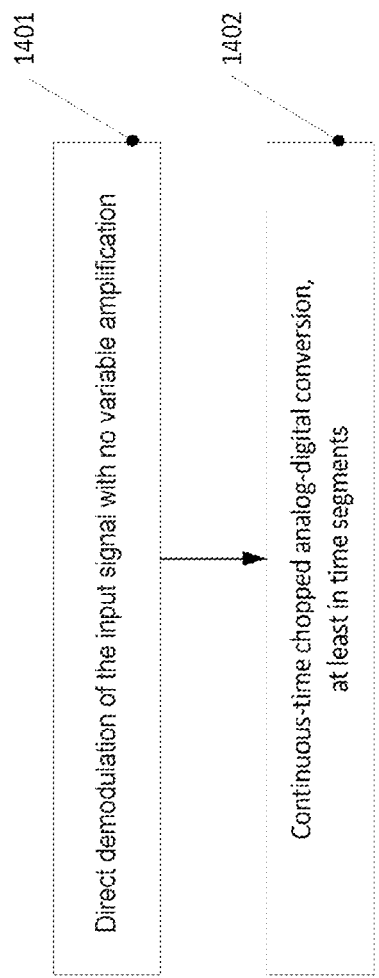
FIG. 14 shows a flow diagram for the illustration of methods according to some exemplary embodiments.

FIG. 14 shows a flow diagram for illustration purposes. The method can be executed by means of the above-mentioned apparatuses and systems and, for the purposes of simplification, is described with reference to the above-mentioned exemplary embodiments. However, the application of the method according to FIG. 14 is not implemented on the basis of the above-mentioned exemplary embodiments.

In 1401, the method comprises a direct demodulation of an input signal which is to be converted with no variable amplification, particularly a passive demodulation using a mixer, which is operated at a demodulation frequency fdemod.

One example is the demodulation by means of the demodulator 33 according to FIG. 2, the demodulator 12 according to FIG. 1 or the demodulator 92 according to FIG. 9. The demodulation can incorporate a low-pass filter function, for which purpose input resistors and a capacitor assembly arranged down-circuit of the demodulator can be employed, as described above. The input resistors can simultaneously be employed for protection against electrostatic discharges.

In 1402, the signal thus demodulated undergoes continuous-time analog-digital conversion at least in time segments, wherein chopper modulators and chopper demodulators are employed, as described above. "At least in time segments", as described above, specifically signifies that a single continuous-time analog-digital converter according to FIG. 3, separate continuous-time analog-digital converters for each channel as per FIG. 11 or multiplexed incremental analog-digital converters as per FIGS. 9 and 10 may be involved. Variations and modifications described above with respect to the apparatuses are correspondingly also applicable to the method according to FIG. 14. The various frequencies, such as the demodulation frequency, the excitation frequency, the chopper frequency or a switchover frequency of a multiplexer fADC can thus be synchronized as described above, feedback can be employed for the reduction of ripple as per FIG. 10, multiplexing can be employed, or dynamic element matching can be employed. This listing is not to be considered as definitive, and all the above-mentioned variations and additions are also applicable to the method in a corresponding form.

In the above-mentioned embodiments, firstly, demodulation is executed by means of a demodulator at a demodulation frequency fdemod and, secondly, chopping is executed at a chopper frequency fchop. In the embodiments discussed hereinafter, a continuous-time analog-digital converter, particularly a sigma-delta analog-digital converter, with inherent chopper and demodulation functions is employed.

Corresponding exemplary embodiments will now be described with reference to FIGS. 15 to 23. Components and elements which have already been employed in the above-mentioned exemplary embodiments have the same reference symbols, and are not described in greater detail again.

FIG. 15A shows a system having an apparatus for analog-digital conversion according to one exemplary embodiment. As described above with reference to FIG. 3, the apparatus for analog-digital conversion according to FIG. 15A receives a signal from a receiver coil 30 at input pads 31A, 31B. In the case of FIG. 15A, no input resistors are provided, and the input voltage Vin which is present on the pads 31A, 31B is fed to a voltage/current converter 80, which essentially corresponds to the voltage/current converter 80 described above with reference to FIG. 8. In this case, however, by way of distinction from FIG. 8, no demodulator and no chopper are present, such that the input voltage Vin present on the pads 31A, 31B is fed directly to the above-mentioned current/voltage converter 80.

The above-mentioned integrating capacitors 310A, 310B are arranged down-circuit of the current/voltage converter 80 via the chopper 39. Capacitance values of the integrating capacitors 310A, 310B can lie within the range of 5 to 30 pF. In the exemplary embodiment according to FIG. 15A, the capacitors 310A, 310 can have smaller capacitance values than in FIG. 3, for example smaller capacitance values by a factor of 10.

The chopper 39 is operated at a chopper frequency fchop which, conversely to the preceding exemplary embodiments, corresponds to the requisite demodulation frequency fdemod. This demodulation frequency fdemod, as discussed above, is given by an average frequency of the signal received by the receiver coil 30. As a result, firstly, integration, in combination with a resistance of the current/voltage converter 80, RC filtering, chopping and demodulation are achieved.

The current/voltage converter 80 is schematically represented in FIG. 15B, wherein the input voltage Vin is present on gate terminals of transistors 1504, 1505, and the output signal is generated by means of current sources 1502, 1503, 1507, 1508. The resistance of the current/voltage converter 80 represented in FIG. 15A corresponds to a resistor 1506 according to FIG. 15B and can have, for example, a value in the order of magnitude of 400Ω, while the drain current of the transistors 1504, 1505 can be in excess of 200 µA.

The correspondingly analog-integrated, demodulated and chopped signal is converted into a digital signal by a digitizer 1500. As will be described hereinafter, this digitizer 1500 can comprise a comparator. The digitized signal, using a multiplier 1501, is then alternately multiplied by +1 and −1 in accordance with the chopper frequency fchop (which, in turn, corresponds here to the demodulation frequency fdemod), in order to generate a digital output signal digout. Moreover, the digital output signal digout is fed back via a digital-analog converter 87, as described above with reference to FIG. 8. In FIG. 15A, moreover, signal waveforms are schematically indicated for illustrative purposes. As designated on the output by digout, the amplitude of the digital output signal is dependent on the frequency at which the system according to FIG. 15A, and particularly the digitizer 1500, is operated, and on the capacitance values Cinteg of the capacitors 310A, 310B.

FIG. 15C shows a differential voltage between the integrating capacitors 310A and 310B against the frequency, and additionally shows various frequency values, namely, the frequency at which the converter is operated, the chopper frequency equal to the demodulation frequency, and a frequency Gm/2π Cinteg, which is given by the transconductance Gm of the voltage/current converter 80 and the capacitance value Cinteg. The transconductance corresponds to the reciprocal of the resistance value of the resistor 1506 of the voltage/current converter 80.

By means of the exemplary embodiment according to FIG. 15A, an inherent chopping and demodulation function can be achieved using a continuous-time analog-digital converter, without the necessity for the provision of a demodulator and a chopper at the input of the voltage/current converter 80. This can reduce the noise of the assembly and save current and chip surface area and also enhance accuracy. Moreover, signal convolution effects and offset errors can be reduced. The RC filtering achieved by means of the resistor 1506 and the capacitors 310A, 310B can improve electromagnetic compatibility.

Figure 16A:
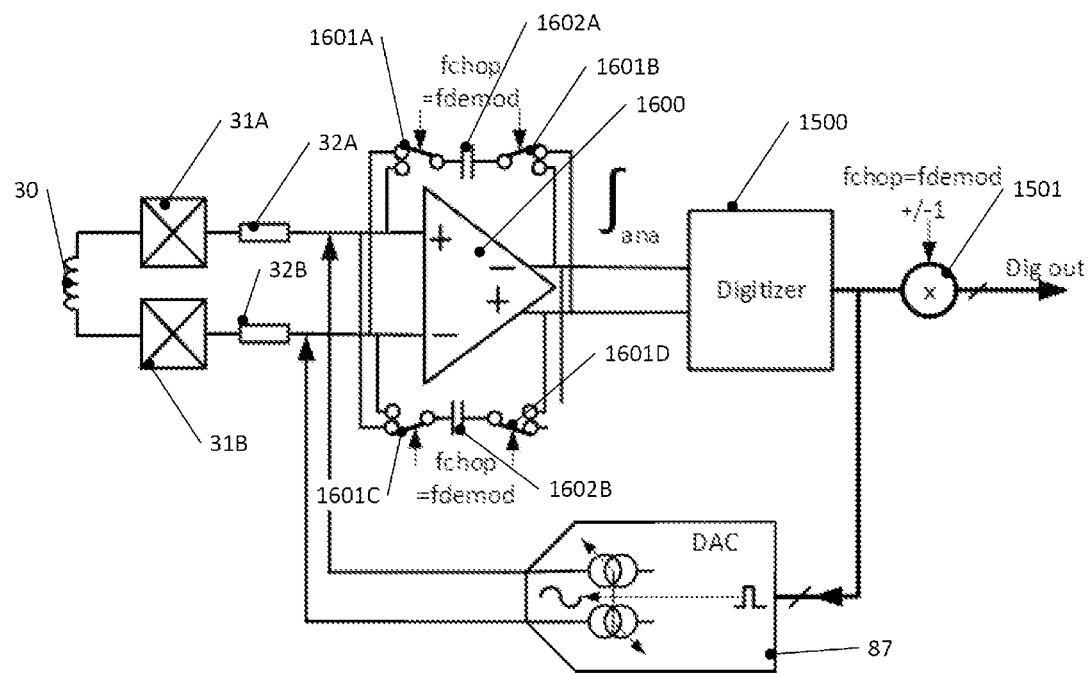
FIG. 16A shows a circuit diagram of a system according to one exemplary embodiment.

As an alternative to the voltage/current converter 80, a corresponding system can also be constructed by means of an operational amplifier, i.e. the signal integration is more effectively considered in the voltage range, rather than an integration of a current on capacitors. A corresponding exemplary embodiment is represented in FIG. 16A. In the exemplary embodiment according to FIG. 16A, in comparison with the exemplary embodiment according to FIG. 15A, the voltage/current converter 80, the chopper 39 and the capacitors 310A, 310B are replaced by an assembly having an operational amplifier 1600, the inputs of which are connected to the pads 31A, 31B via input resistors 32A, 32B. A resistance value of the resistors 32A, 32B can lie in the order of magnitude of 400Ω In place of the capacitors 310A, 310B, in the exemplary embodiment according to FIG. 16A, switched capacitors 1602A, 1602B are provided in feedback paths of the operational amplifier 1600, as represented, which, by means of two-way switches 1601A to 1601D, can optionally be interconnected with the inputs or the outputs of the operational amplifier 1600. The two-way switches 1601A to 1601D are operated at the chopper frequency fchop which, in turn, as per the exemplary embodiment according to FIG. 15A, is equal to the demodulation frequency fdemod.

Figure 16B:
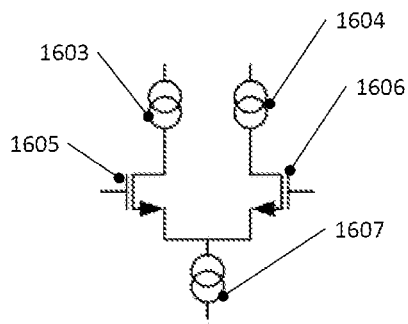
FIG. 16B illustrates an operational amplifier according to FIG. 16A.

An equivalent circuit diagram of the operational amplifier 1600 is shown in FIG. 16B, having current sources 1603, 1604 and 1607 and also with input transistors 1605, 1606, at the gate terminals of which the input voltage from the pads 31A, 31B is applied via the resistors 32A, 32B.

In other respects, the exemplary embodiment according to FIG. 16A corresponds to that represented in FIG. 15A, wherein, in this case, the output of the digital-analog converter is fed back to the inputs of the operational amplifier 1600.

In this case, a RC filter is formed by the resistors 32A, 32B and the capacitors 1602A, 1602B. Here again, by means of the capacitors 1602A, 1602B, an integration function is executed. Additionally, chopping and demodulation are executed, in a similar manner to that described above with respect to FIG. 15A.

Although, in FIGS. 15A and 16A, an inherent RC filtering function is provided, for the improvement of electromagnetic compatibility, for example, an additional RC filter can be provided, which can have a lower rating in comparison with apparatuses which comprise no integrated RC filtering function by way of integrating capacitors.

The exemplary embodiment according to FIG. 16A, in the event of higher temperatures, can have advantages over the exemplary embodiment according to FIG. 15A.

The following table shows various examples of input voltages, input resistances 32A, 32B, capacitances Cint of the capacitors 1602A, 1602D, ADC frequencies f ADC and voltages on the integrator for the purposes of further illustration. As can be seen, for higher input voltages having lower input resistances, a higher integration capacitance is required correspondingly, in order to keep the voltage to be integrated sufficiently low.

| Vin [mV] | 4 | 120 | 120 | 120 |
|---|---|---|---|---|
| Rin [kΩ] | 0.4 | 4 | 0.4 | 0.4 |
| Cint [pF] | 10 | 10 | 10 | 20 |
| fADC [MH] | 20 | 20 | 20 | 20 |
| Vinteg [V] | 0.05 | 0.15 | 1.5 | 0.375 |

The response described above with reference to FIG. 4 with respect to FIG. 3 also applies to the exemplary embodiments according to FIGS. 15A and 16A with respect to the inherent RC filtering function described in consideration of the respective integrating capacitances.

Figure 17A:
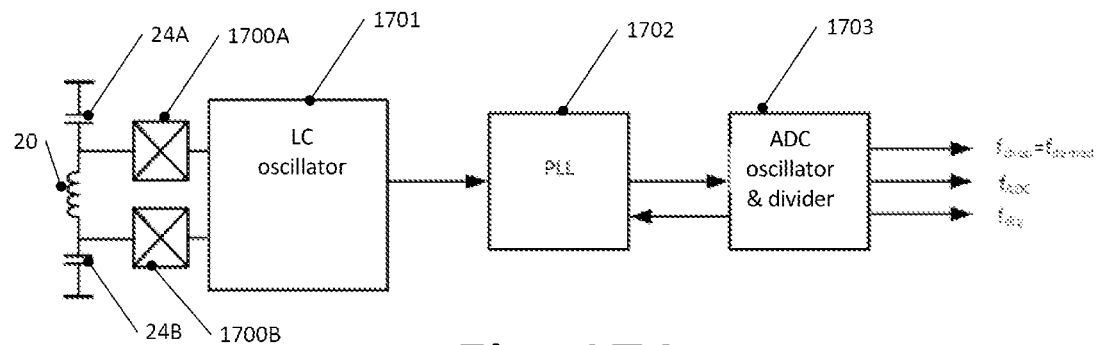
FIGS. 17A to 17C show various exemplary embodiments for the synchronization of signals.

As described above, the demodulation frequency which, in the exemplary embodiments according to FIGS. 15A and 16A, is equal to the chopper frequency, in some exemplary embodiments, is synchronized with an average frequency of a signal received by the receiver coil 30 and with a frequency fADC at which the analog-digital converter is operated and the digital signal is output. Using the frequency fADC, in the above-mentioned exemplary embodiments and also in the exemplary embodiments described hereinafter, for example, the digitizer 1500, the comparator 82, the digital integrator 83, the thermometer/binary encoder 86 and the digital-analog converter 87 are controlled. Examples of a synchronization of this type are represented in FIGS. 17A to 17C.

In the exemplary embodiment according to FIG. 17A, a LC oscillator 1701 generates a signal, which is output via pads 1700A, 1700B to the excitation coil 20 described above with reference to FIG. 2, which is coupled to the capacitors 24A, 24B, likewise described with reference to FIG. 2. The signal generated by the LC oscillator 1701 is additionally output to a phase-locked loop (PLL) 1702 which, by means of an oscillator and divider 1703 (designated here as an ADC oscillator/divider) generates the chopper frequency fchop equal to fdemod, the frequency fADC and the frequency fdig. fADC can also be equal to fchop. fADC can be generated, for example, from fdig by frequency division. For example, fdig can be 40 MHz and fADC 10 MHz. fdig thus, as it were, serves as a basis for the generation of fADC. In FIG. 17A, fchop, fADC and fdig are thus synchronized with the excitation frequency which the LC oscillator 1701 generates for the excitation coil 20, in that the output signal of the LC oscillator 1701 is fed to the phase-locked loop 1702 as a reference, by means of which, in turn, the ADC oscillator 1703 is controlled.

Figure 17B:
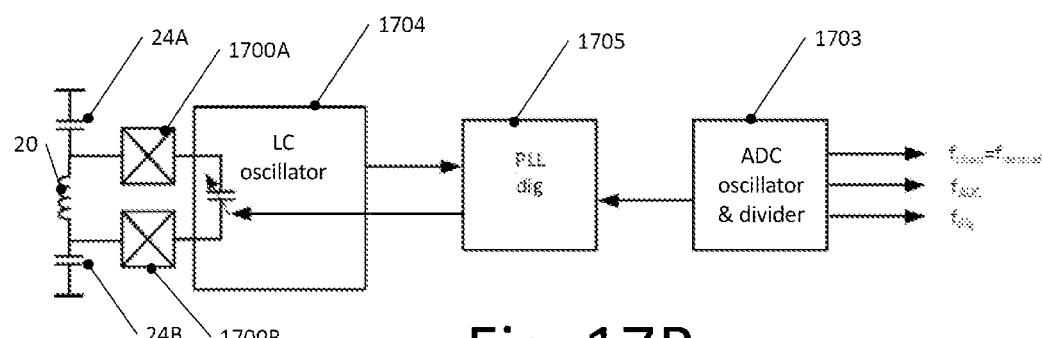

In FIG. 17B, in place of the LC oscillator 1701, a controllable LC oscillator 1704 is provided which, for example, can incorporate a variable capacitance, as represented. This capacitance is controlled by means of a digital PLL 1705, such that the frequency generated by the LC oscillator 1704 is set to a frequency generated by the ADC oscillator 1703, which is fed to the digital PLL 1705 as a reference frequency. Whereas, in FIG. 17A, the ADC oscillator 1703 is thus controlled in accordance with the frequency of the LC oscillator 1701 by means of the PLL 1702, in FIG. 17B, the reverse path is followed, namely, the frequency of the LC oscillator 1704, by means of the digital PLL 1705, is set to the frequency of the ADC oscillator 1703. In both cases, the frequencies fchop, fADC and fdig can then also be generated by means of frequency dividers, which are interconnected with the ADC oscillator 1703. The above-mentioned reference frequency can also be frequency-divided, e.g. a frequency-divided version of fdig.

Figure 17C:
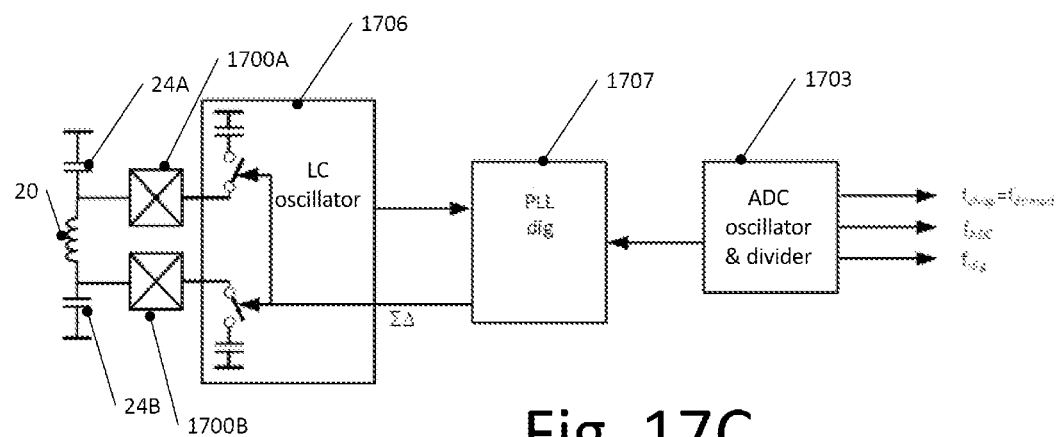

A variant of FIG. 17B is represented in FIG. 17C. In the exemplary embodiment according to FIG. 17C, a LC oscillator 1706 is provided for the generation of the excitation signal for the excitation coil 20, which comprises two switchable capacitors, as represented. These are actuated by a digital PLL 1707 using a sigma-delta data stream. Otherwise, the mode of operation of FIG. 17C corresponds to that of FIG. 17D.

Variations in the exemplary embodiments according to FIGS. 15A and 16A will now be described with reference to FIGS. 18 to 22.

Figure 18:
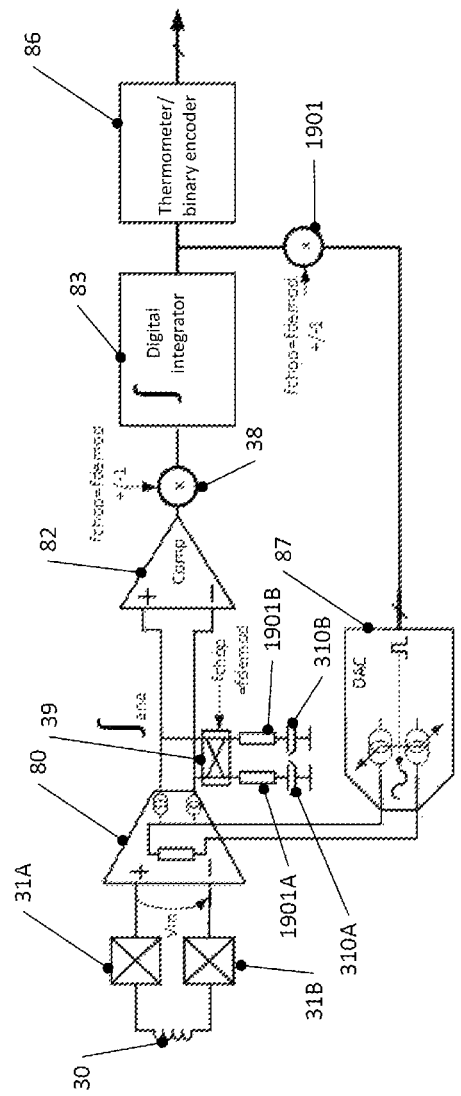
FIGS. 18 to 22 show circuit diagrams of systems according to various exemplary embodiments.

FIG. 18 shows a variation of the exemplary embodiment according to FIG. 15A. In FIG. 18, in comparison with FIG. 15A, resistors 1901A, 1901B are arranged up-circuit of the capacitors 310A, 310B. The resistors 1901A and 1902B generate a zero point in the transmission function of the apparatus which, in some exemplary embodiments, comprises an uncontrolled boosting of the analog-digital converter loop, in the case according to FIG. 18 essentially a sigma-delta loop, comprised of an analog integrator (by the integrating capacitors 310A, 310B), a digital integrator 83 and the digital-analog converter 87. The phase angle downcircuit of the 2 integrators in the loop can be −180° which, in some cases, might signify an uncontrolled boosting in the feedback. The zero point by way of the introduced resistors 1901A, 1901B is capable of reducing this phase angle or, in other words, expanding the phase margin.

Moreover, in FIG. 18, the digitizer 1500 according to FIG. 15A, in a similar manner to FIG. 8, is embodied by a comparator 82, a digital integrator 83 and a thermometer/binary encoder 86. The multiplier 1501 according to FIG. 15A, in this case, is embodied by a first multiplier 38 between the comparator 82 and the digital integrator 83 and a second multiplier 1901 in a feedback path to the above-mentioned digital-analog converter 87.

In other respects, the mode of operation of the exemplary embodiment according to FIG. 18 corresponds to that of FIG. 15A. As per FIG. 8, the counter 85 and the adder 84 can additionally be provided in parallel to the digital integrator 83, as described with reference to FIG. 8.

Figure 19:
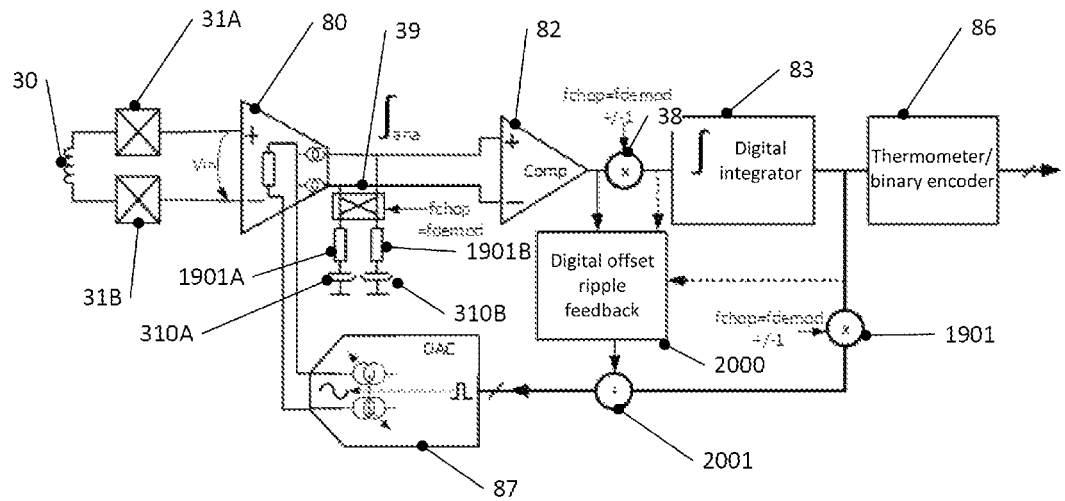

FIG. 19 shows a further exemplary embodiment, which supplements the exemplary embodiment according to FIG. 18 by a feedback arrangement for the elimination of offset ripple 2000. In this case, a signal up-circuit or down-circuit of the multiplier 38 is filtered and, by means of an adder 2001, is added to the input of the digital-analog converter 87, in order to eliminate any ripple which arises due to chopping and the like. This can essentially be executed as described above with reference to FIG. 10. Further implementations and further information on feedback arrangements of this type for the elimination of chopper-induced ripple can also be gathered from German patent application DE 10 2020 111 914.3 filed by the applicant.

Essentially, although chopping eliminates an offset, i.e. a DC voltage offset, an alternating voltage (AC) ripple is generated in the output signal as a result. This is compensated by the additional digital offset ripple feedback 2000.

Figure 20:
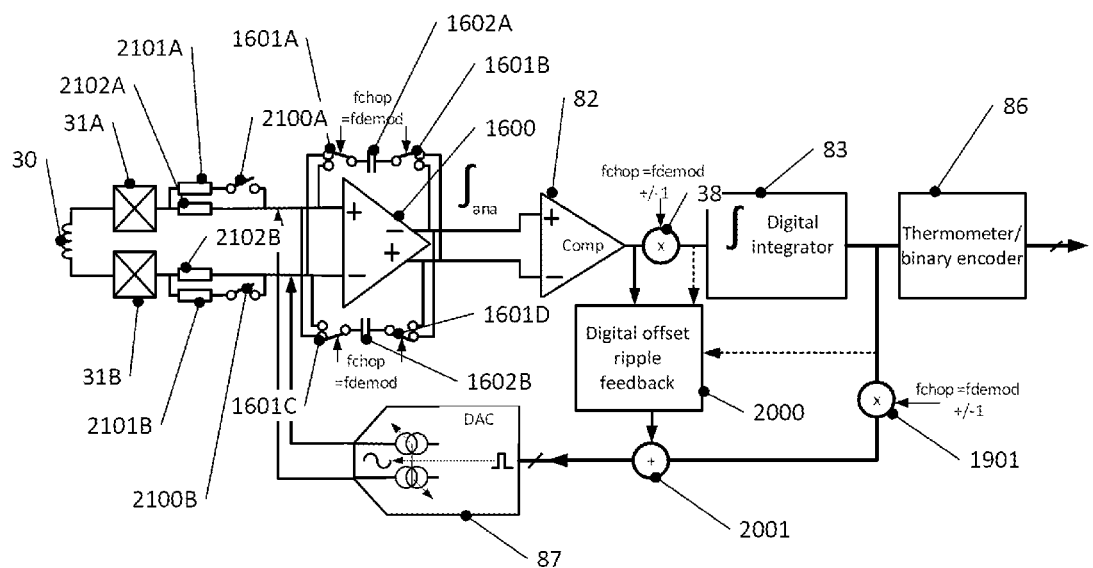

FIG. 20 shows a modification of the exemplary embodiment according to FIG. 16A. Additionally to FIG. 16A, in this case, the digitizer 1500 and the multiplier 1501, as per FIG. 19, are implemented by means of the comparator 82, the multiplier 38, the digital integrator 83, the thermometer/binary encoder 86 and the multiplier 1901. Moreover, as per FIG. 19, the digital offset ripple feedback 2000 is implemented by means of the adder 2001. Finally, the exemplary embodiment according to FIG. 20 comprises switchable input resistors 2101A, 2101B or 2102A, 2102B, wherein the resistors 2101A, 2101B can be activated and deactivated by means of switches 2100A, 2100B. The resistors 2101A, 2102B can have, for example, resistance values which are lower by a factor of 10 than the resistors 2102A, 2102B such that, when the switches 2100A, 2100B are closed, the resistors 2101A, 2101B determine the total input resistance. For example, the resistors 2101A, 2101B can have resistance values of approximately 400 ohms, and the resistors 2102A, 2102B can have resistance values, for example, of 4 kΩ In this manner, a switchover can be executed between different input signal ranges. The various modifications to FIG. 20, in relation to FIG. 16A (implementation of the digitizer, digital offset ripple feedback and switchable input resistors) can be implemented in a mutually independent manner, although, in FIG. 20, they are represented in combination.

Figure 21:
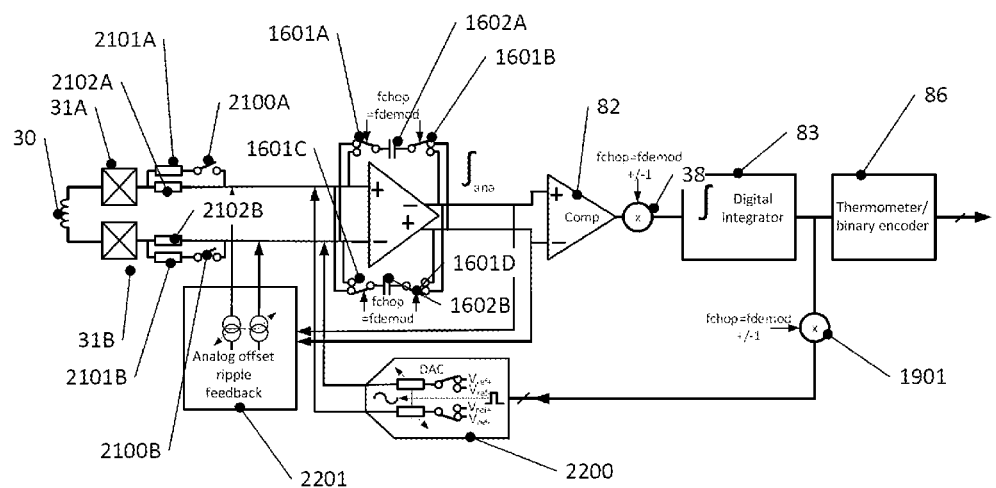

FIG. 21 shows a variant of the exemplary embodiment according to FIG. 20. In place of the digital offset ripple feedback 2000, in this case, analog offset ripple feedback 2201 is provided, which is additionally applied to the inputs of the operational amplifier 1600 in accordance with signals which are tapped off at the input of the comparator 82. Moreover, in place of the digital-analog converter 87, a digital-analog converter 2200 is provided, comprising switchable resistors which can be set to an input voltage or a reference voltage. A digital-analog converter of this type is also employed in conventional accessory set-ups in combination with operational amplifiers in place of current-controlled digital-analog converters, such as the digital-analog converter 87. These variants (analog feedback 2201 and digital-analog converter 2200) can also be implemented in a mutually independent manner.

Figure 22:
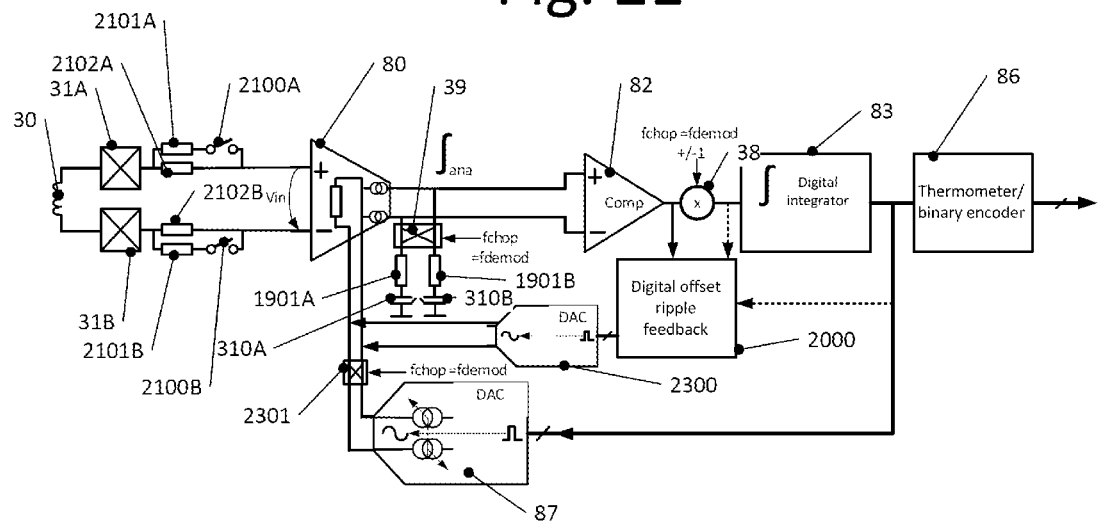

FIG. 22 shows a modification to FIG. 19. In this case, in place of the digital offset ripple feedback 2000, which is applied to the input of the digital-analog converter 87 via the adder 2001, the output of the digital offset ripple feedback 2000 is fed via a separate analog-digital converter 2300 to the voltage/current converter 80. In place of the multiplier 1901, a chopper 2301 is then provided on the output of the digital-analog converter 87. Accordingly, as can be seen from FIGS. 19 to 22, there are various options for the elimination of the offset ripple.

In other respects, modifications and variations which have been discussed with respect to the exemplary embodiments according to FIGS. 1 to 14 are also applicable to the exemplary embodiments according to FIGS. 15 to 22.

Some exemplary embodiments are defined by the following examples:

Example 1. An apparatus for analog-digital conversion, comprising:

a demodulator for the demodulation of an input signal using a demodulation signal which has a demodulation frequency, with no variable preamplification, a chopper modulator arranged down-circuit of the demodulator for chopping on the basis of a chopper signal, an analog-digital converter arranged down-circuit of the chopper modulator and operating in continuous-time mode at least in time segments, and a chopper demodulator for chopping on the basis of the chopper signal.

Example 2. The apparatus according to example 1, wherein the demodulator comprises a mixer for the combination of the input signal with the demodulation signal.

Example 3. The apparatus according to example 1 or 2, wherein the demodulator comprises at least one up-circuit input resistor and a down-circuit capacitor assembly, wherein the at least one input resistor and the capacitor assembly form a low-pass filter.

Example 4. The apparatus according to one of examples 1 to 3, wherein a demodulation frequency of the demodulation signal is a whole-number multiple of a chopper frequency of the chopper signal.

Example 5. The apparatus according to one of the preceding examples, wherein the analog-digital converter comprises integrating capacitors, which are connected to the remainder of the analog-digital converter via a chopper apparatus, which operates on the basis of the chopper signal.

Example 6. The apparatus according to one of the preceding examples, wherein the input signal is fed directly to the demodulator.

Example 7. An apparatus for analog-digital conversion, comprising:

an analog-digital converter operating in continuous-time mode at least in time segments, comprising:

at least one integrating capacitor, which is connected to the remainder of the analog-digital converter in accordance with a chopper signal, wherein the chopper signal has a frequency which is equal to a demodulation frequency for the demodulation of an input signal of the apparatus, and a chopper demodulator for chopping on the basis of the chopper signal.

Example 8. The apparatus according to example 7, wherein the analog-digital converter comprises a voltage/current converter, wherein inputs of the voltage/current converter are designed to receive the input signal, and wherein the at least one integrating capacitor is connected to outputs of the voltage/current converter via a chopper apparatus, which operates on the basis of the chopper signal.

Example 9. The apparatus according to example 8, wherein the at least one integrating capacitor is connected to the chopper apparatus via at least one resistor.

Example 10. The apparatus according to one of examples 1 to 9, wherein the analog-digital converter comprises multiple parallel voltage/current converters, wherein inputs of the multiple voltage/current converters are designed to optionally receive the input signal.

Example 11. The apparatus according to example 7, wherein the analog-digital converter comprises an operational amplifier, wherein inputs of the operational amplifier are designed to receive the input signal, and wherein the at least one integrating capacitor, by means of two-way switches, which are switched on the basis of the chopper signal, is switched between inputs and outputs of the operational amplifier.

Example 12. The apparatus according to one of examples 1 to 11, wherein the analog-digital converter comprises at least one analog-digital converter from the group comprising a continuous-time sigma-delta analog-digital converter and an analog-digital converter having an incremental converter operating in a continuous-time mode.

Example 13. The apparatus according to one of examples 1 to 12, wherein the analog-digital converter comprises a feedback path for the reduction of ripple generated by chopping.

Example 14. The apparatus according to one of examples 1 to 13, wherein the apparatus is designed for the processing of multiple input channels by the analog-digital converter, and comprises a multiplexer for the selection of an input channel which is to be processed.

Example 15. The apparatus according to example 14 and one of examples 1 to 6, wherein the multiplexer is combined with the demodulator.

Example 16. The apparatus according to example 14 or 15, wherein a chopper frequency of the chopper signal is a whole-number multiple of, or is equal to an alternating frequency, at which the multiplexer switches between the input channels.

Example 17. The apparatus according to one of examples 1 to 16, wherein the apparatus is designed for the parallel processing of multiple input channels, wherein a plurality of analog-digital converters comprising the analog-digital converter is provided, wherein the apparatus comprises a dynamic element matching device for the processing of the signals from the input channels.

Example 18. The apparatus according to one of examples 1 to 17, further comprising a device for the selection of an input range of the analog-digital converter by means of a control input of the analog-digital converter.

Example 19. The apparatus according to one of examples 1 to 18, wherein the apparatus further comprises switchable input resistors for the selection of an input range of the analog-digital converter.

Example 20. A system, comprising:
a sensor, and
an apparatus for analog-digital conversion according to one of examples 1 to 19 for processing a signal from the sensor.

Example 21. The system according to example 20, wherein the sensor comprises an inductive sensor having an excitation coil and at least one receiver coil, from which the input signal can be tapped, wherein the demodulation frequency is equal to an excitation frequency of an excitation signal which is fed to the excitation coil.

Example 22. The system according to example 20 or 21, wherein a clock frequency of the analog-digital converter is a whole-number multiple of or is equal to the frequency of the demodulation signal.

Example 23. The system according to one of examples 20 to 22, further comprising a phase-locked loop for the synchronization of the demodulation frequency with the excitation frequency and/or with the clock frequency of the analog-digital converter.

Example 24. A method for analog-digital conversion, comprising:
direct demodulation of an input signal with no variable preamplification, and
continuous-time analog-digital conversion, at least in time segments, of the demodulated input signal with chopper modulation and chopper demodulation at a chopper frequency.

Example 25. The method according to example 24, wherein the direct demodulation comprises mixing of the input signal with the demodulation signal.

Example 26. The method according to example 24 or 25, wherein a demodulation frequency of the demodulation is a whole-number multiple of a chopper frequency of the chopper modulation and chopper demodulation.

Example 27. The method according to one of examples 24 to 26, wherein an analog-digital converter comprises integrating capacitors, wherein the method further comprises:
chopping of a connection of the integrating capacitors with the remainder of the analog-digital converter.

Example 28. A method for analog-digital conversion, comprising continuous-time analog-digital conversion, at least in time segments, of an input signal, wherein the continuous-time analog-digital conversion, at least in time segments, comprises operation of integrating capacitors on the basis of a chopper signal, wherein the chopper signal has a chopper frequency which is equal to a demodulation frequency for the demodulation of an input signal which is to be converted.

Example 29. The method according to one of examples 24 to 28, wherein the method for the processing of multiple input channels comprises multiplexing for the selection of an input channel to be processed, wherein the chopper frequency is a whole-number multiple of an alternating frequency at which the multiplexing switches between the input channels.

Example 30. The method according to one of examples 24 to 29, wherein the method for the processing of multiple input channels comprises multiplexing for the selection of an input channel to be processed.

Although specific exemplary embodiments have been illustrated and described in this description, persons having customary expert knowledge will be aware that a multiplicity of alternative and/or equivalent implementations, by way of substitution for the specific exemplary embodiments represented and described in this description, can be selected without departing from the scope of the invention disclosed. It is intended that this application encompasses all adaptations or variations of the specific exemplary embodiments which are discussed herein. It is therefore intended that this invention is only limited by the claims and the equivalents to the claims.

What is claimed is:

1. An apparatus for analog-digital conversion, comprising:
a demodulator configured to demodulate an input signal using a demodulation signal, which has a demodulation frequency, with no variable preamplification;
a chopper modulator arranged down-circuit from the demodulator for chopping based on a chopper signal;
an analog-digital converter arranged down-circuit from the chopper modulator and configured to operate in a continuous-time mode at least in time segments; and
a chopper demodulator arranged down-circuit from the analog-digital converter for chopping based on the chopper signal.

2. The apparatus as claimed in claim 1, wherein the demodulator comprises a mixer configured to combine the input signal with the demodulation signal.

3. The apparatus as claimed in claim 1, wherein the demodulator comprises at least one up-circuit input resistor and a down-circuit capacitor assembly, wherein the at least one input resistor and the capacitor assembly form a low-pass filter.

4. The apparatus as claimed in claim 1, wherein a demodulation frequency of the demodulation signal is a whole-number multiple of a chopper frequency of the chopper signal.

5. The apparatus as claimed in claim 1, wherein the analog-digital converter comprises integrating capacitors, which are connected to a remainder of the analog-digital converter via a chopper circuit, which operates based on the chopper signal.

6. The apparatus as claimed in claim 1, wherein the analog-digital converter comprises multiple parallel voltage/current converters, wherein inputs of the multiple voltage/current converters are configured to optionally receive the input signal.

7. The apparatus as claimed in claim 1, wherein the analog-digital converter is a continuous-time sigma-delta analog-digital converter or an analog-digital converter having an incremental converter operating in continuous-time mode.

8. The apparatus as claimed in claim 1, wherein the analog-digital converter comprises a feedback path for reduction of ripple generated by chopping.

9. The apparatus as claimed in claim 1, wherein the apparatus is configured for processing of multiple input channels by the analog-digital converter and comprises a multiplexer for a selection of an input channel to be processed by the analog-digital converter.

10. The apparatus as claimed in claim 9, wherein the multiplexer is combined with the demodulator.

11. The apparatus as claimed in claim 9, wherein a chopper frequency of the chopper signal is a whole-number multiple of an alternating frequency or is equal to the alternating frequency, and the multiplexer switches is configured to switch between the input channels at the alternating frequency.

12. The apparatus as claimed in claim 1, wherein the apparatus is configured for parallel processing of multiple input channels, wherein the apparatus further comprises:
a plurality of analog-digital converters comprising the analog-digital converter; and
a dynamic element matching device for the processing of signals from the multiple input channels.

13. The apparatus as claimed in claim 1, further comprising:
a range selection device configured to select an input range of the analog-digital converter by means of a control input of the analog-digital converter.

14. The apparatus as claimed in claim 1, wherein the apparatus further comprises:
switchable input resistors configured to select an input range of the analog-digital converter.

15. An apparatus for analog-digital conversion, comprising:
an analog-digital converter operating in continuous-time mode, at least in time segments, the analog-digital converter comprising:
at least one integrating capacitor, which is connected to a remainder of the analog-digital converter in accordance with a chopper signal, wherein the chopper signal has a frequency which is equal to a demodulation frequency for a demodulation of an input signal of the apparatus; and
a chopper demodulator arranged down-circuit from the analog-digital converter for chopping based on the chopper signal.

16. The apparatus as claimed in claim 15, wherein the analog-digital converter comprises a voltage/current converter, wherein inputs of the voltage/current converter are configured to receive the input signal, and wherein the at least one integrating capacitor is connected to outputs of the voltage/current converter via a chopper circuit, which operates based on the chopper signal.

17. The apparatus as claimed in claim 16, wherein the at least one integrating capacitor is connected to the chopper circuit via at least one resistor.

18. The apparatus as claimed in claim 15, wherein the analog-digital converter comprises an operational amplifier, wherein inputs of the operational amplifier are configured to receive the input signal, and wherein the at least one integrating capacitor, by means of two-way switches which are switched based on the chopper signal, is switched between the inputs and outputs of the operational amplifier.

19. A system, comprising:
a sensor configured to generate a sensor signal; and
a demodulator configured to demodulate the sensor signal using a demodulation signal, which has a demodulation frequency, with no variable preamplification;
a chopper modulator arranged down-circuit from the demodulator for chopping based on a chopper signal;
an analog-digital converter arranged down-circuit from the chopper modulator and configured to operate in a continuous-time mode at least in time segments; and
a chopper demodulator arranged down-circuit from the analog-digital converter for chopping based on the chopper signal.

20. The system as claimed in claim 19, wherein the sensor comprises an inductive sensor having an excitation coil and at least one receiver coil, from which the sensor signal can be tapped, wherein the demodulation frequency is equal to an excitation frequency of an excitation signal that is fed to the excitation coil.

21. The system as claimed in claim 20, wherein a clock frequency of the analog-digital converter is a whole-number multiple of the demodulation signal or is equal to the demodulation frequency of the demodulation signal.

22. The system as claimed in claim 21, further comprising:
a phase-locked loop configured to synchronize the demodulation frequency with at least one of the excitation frequency and the clock frequency of the analog-digital converter.

23. A method for analog-digital conversion, comprising:
directly demodulating an input signal with no variable preamplification; and
performing a continuous-time analog-digital conversion, at least in time segments, of the demodulated input signal with chopper modulation at a chopper frequency and chopper demodulation at the chopper frequency.

24. The method as claimed in claim 23, wherein directly demodulating comprises a combining the input signal with the demodulated input signal.

25. The method as claimed in claim 23, wherein a demodulation frequency of the direct demodulation is a whole-number multiple of the chopper frequency.

26. The method as claimed in claim 23, wherein an analog-digital converter comprises integrating capacitors, wherein the method further comprises:
chopping of a connection of the integrating capacitors with a remainder of the analog-digital converter.

27. A method for analog-digital conversion, comprising:
performing a continuous-time analog-digital conversion, at least in time segments, of an input signal, wherein the continuous-time analog-digital conversion comprises operating integrating capacitors based on a chopper signal, wherein the chopper signal has a chopper frequency that is equal to a demodulation frequency used for demodulation of the input signal that is to be converted.

28. The method as claimed in claim 27, further comprising:
processing multiple input channels, including multiplexing for a selection of an input channel to be processed, wherein the chopper frequency is a whole-number multiple of an alternating frequency at which the multiplexing switches between the multiple input channels.

* * * * *

UNITED STATES PATENT AND TRADEMARK OFFICE
CERTIFICATE OF CORRECTION

PATENT NO. : 11,728,823 B2
APPLICATION NO. : 17/534635
DATED : August 15, 2023
INVENTOR(S) : Edwin Mario Motz et al.

It is certified that error appears in the above-identified patent and that said Letters Patent is hereby corrected as shown below:

In the Claims

Claim 11:
Column 25, Line 38, change "alternating frequency, and the multiplexer switches is con-" to
--alternating frequency, and the multiplexer is con- --

Signed and Sealed this
Nineteenth Day of September, 2023

Katherine Kelly Vidal
*Director of the United States Patent and Trademark Office*